United States Patent

Iwami

(10) Patent No.: US 9,591,743 B2
(45) Date of Patent: Mar. 7, 2017

(54) CONDUCTIVE LAMINATE BODY, TOUCH PANEL, AND DISPLAY DEVICE

(71) Applicant: FUJIFILM Corporation, Tokyo (JP)

(72) Inventor: Kazuchika Iwami, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 386 days.

(21) Appl. No.: 14/103,448

(22) Filed: Dec. 11, 2013

(65) Prior Publication Data

US 2014/0098307 A1   Apr. 10, 2014

Related U.S. Application Data

(63) Continuation of application No. PCT/JP2012/067621, filed on Jul. 10, 2012.

(30) Foreign Application Priority Data

Jul. 11, 2011   (JP) .................. 2011-152648

(51) Int. Cl.
*G06F 3/041*   (2006.01)
*G02F 1/1335*   (2006.01)
(Continued)

(52) U.S. Cl.
CPC ............. *H05K 1/0213* (2013.01); *B32B 7/12* (2013.01); *B32B 15/02* (2013.01); *B32B 15/08* (2013.01);
(Continued)

(58) Field of Classification Search
None
See application file for complete search history.

(56) References Cited

U.S. PATENT DOCUMENTS 6,548,177 B2 * 4/2003 Hieda ............... B32B 17/10018
                                                                            428/220
7,224,874 B2 * 5/2007 Iwasaki .................. G02B 6/102
                                                                            385/129

(Continued)

FOREIGN PATENT DOCUMENTS

JP   10-041662 A   2/1998
JP   2002-140014 A   5/2002

(Continued)

OTHER PUBLICATIONS

Japanese Office Action issued in corresponding Japanese Application No. 2011-152648 on Feb. 10, 2015, along with a partial English translation thereof.

(Continued)

*Primary Examiner* — Dismery Mercedes
(74) *Attorney, Agent, or Firm* — Birch, Stewart, Kolasch & Birch, LLP

(57) ABSTRACT

This present invention pertains to: a conductive laminate body, a touch panel, and a display device. In the present invention, the relative refractive index of a substrate with respect to a first protective sheet, and/or the relative refractive index of the substrate with respect to a second protective sheet is 0.86-1.15. The relative refractive index of a first substrate with respect to the first protective sheet, and/or the relative refractive index of a second substrate with respect to the second protective sheet is 0.86-1.15.

24 Claims, 18 Drawing Sheets

(51) Int. Cl.
*G09G 3/30* (2006.01)
*H05K 1/02* (2006.01)
*B32B 15/02* (2006.01)
*G02B 5/18* (2006.01)
*G06F 3/044* (2006.01)
*B32B 7/12* (2006.01)
*B32B 15/08* (2006.01)
*B32B 27/30* (2006.01)
*B32B 27/36* (2006.01)

(52) U.S. Cl.
CPC .......... *B32B 27/302* (2013.01); *B32B 27/304* (2013.01); *B32B 27/36* (2013.01); *G02B 5/1814* (2013.01); *G06F 3/041* (2013.01); *G06F 3/044* (2013.01); *B32B 2307/20* (2013.01); *B32B 2307/202* (2013.01); *B32B 2307/208* (2013.01); *B32B 2307/412* (2013.01); *G06F 2203/04103* (2013.01); *G06F 2203/04112* (2013.01); *G09G 2320/0233* (2013.01); *G09G 2320/0626* (2013.01); *G09G 2320/0653* (2013.01); *G09G 2320/103* (2013.01)

(56) References Cited

U.S. PATENT DOCUMENTS

| | | | | |
|---|---|---|---|---|
| 7,663,306 | B2* | 2/2010 | Imamura | H01L 27/3279 313/489 |
| 8,068,186 | B2* | 11/2011 | Aufderheide | G06F 3/044 349/12 |
| 8,426,749 | B2* | 4/2013 | Saneto | H05K 9/0096 174/381 |
| 8,462,278 | B2* | 6/2013 | Nashiki | G06F 3/044 349/12 |
| 8,854,585 | B2* | 10/2014 | Kizu | G02F 1/133707 349/139 |
| 8,907,224 | B2* | 12/2014 | Kajiya | G02B 1/10 174/250 |
| 8,917,252 | B2* | 12/2014 | Kuriki | G06F 3/044 178/18.01 |
| 9,095,010 | B2* | 7/2015 | Kuriki | H05B 3/84 |
| 9,354,378 | B2* | 5/2016 | Ookubo | G02B 6/0061 |
| 2003/0052867 | A1 | 3/2003 | Shigetaka et al. | |
| 2008/0138589 | A1* | 6/2008 | Wakabayashi | G06F 3/044 428/195.1 |
| 2009/0052195 | A1* | 2/2009 | Saneto | G02B 5/0278 362/355 |
| 2009/0073085 | A1* | 3/2009 | Saneto | H05K 9/0096 345/36 |
| 2009/0133922 | A1* | 5/2009 | Okazaki | H05K 9/0096 174/389 |
| 2010/0182253 | A1* | 7/2010 | Park | G06F 3/044 345/173 |
| 2010/0238133 | A1* | 9/2010 | Wu | G06F 3/044 345/174 |
| 2011/0102370 | A1* | 5/2011 | Kono | G06F 3/044 345/174 |
| 2011/0151215 | A1* | 6/2011 | Kobayashi | B32B 7/02 428/212 |
| 2012/0325545 | A1* | 12/2012 | Higashitani | H05K 9/0094 174/268 |
| 2014/0111711 | A1* | 4/2014 | Iwami | B32B 7/02 349/12 |

FOREIGN PATENT DOCUMENTS

| | | |
|---|---|---|
| JP | 2003-99185 A | 4/2003 |
| JP | 2010-61425 A | 3/2010 |
| JP | 2011-29037 A | 2/2011 |
| JP | 2011-129112 A | 6/2011 |
| JP | 2011-134311 A | 7/2011 |
| WO | WO 95/27334 A1 | 10/1995 |
| WO | WO 97/18508 A1 | 5/1997 |
| WO | WO 2011/062301 A1 | 5/2011 |

OTHER PUBLICATIONS

Chinese Office Action dated Feb. 3, 2016 issued in corresponding Chinese Application No. 201280034050.0 with an English Translation.

* cited by examiner

CONDUCTIVE LAMINATE BODY, TOUCH PANEL, AND DISPLAY DEVICE

CROSS-REFERENCE TO RELATED APPLICATIONS AND PRIORITY CLAIM

This application is a Continuation of International Application No. PCT/JP2012/067621 filed on Jul. 10, 2012, which was published under PCT Article 21(2) in Japanese, which is based upon and claims the benefit of priority from Japanese Patent Application No. 2011-152648 filed on Jul. 11, 2011, the contents all of which are incorporated herein by reference.

TECHNICAL FIELD

The present invention relates to a conductive laminate body, a touch panel, and a display device.

BACKGROUND ART

Recently, electronic devices that incorporate touch panels therein have been spreading widely. Touch panels are mounted in many devices including small screen, such as portable phones, PDAs (Personal Digital Assistants), or the like. In the future, it can be envisaged sufficiently that such touch panels will be incorporated into equipment having large sized screens that serve as PC (Personal Computer) displays or the like.

In the case of conventional touch panel electrodes, indium tin oxide (ITO: Indium Tin Oxide) primarily is used in view of the translucent properties thereof. It is known that the electric resistance per unit area of ITO is comparatively high compared to other metals or the like. More specifically, in the case of ITO, as the (total area of the touch panel) screen size increases, the surface resistivity in the electrode as a whole tends to increase. As a result, a problem arises in that the transmission speed of current between the electrodes becomes slower, such that the time (i.e., response speed) required to detect the contact position after the touch panel has been touched is delayed.

Therefore, various techniques have been proposed in which surface resistivity is decreased by constituting the electrodes in plurality, in the form of a lattice by means of thin wires (thin metal wires) made up from metals having low electrical resistance (see, for example, International Publication No. 1995/27334, International Publication No. 1997/18508, and Japanese Laid-Open Patent Publication No. 2003-099185).

SUMMARY OF INVENTION

However, in the case of using a metal, which is a non-translucent material, as the electrode of a touch panel, a difference in the amount of light transmitted through the electrode in accordance with the presence or absence of the thin metal wires is increased. Thus, shading corresponding to the shape of the pattern formed by the electrode becomes significant, which is easily visible to the user. In particular, in the case of a mesh pattern in which the same mesh shapes are arranged regularly, there is a disadvantage in that moiré phenomena (interference patterns) are easily generated.

The present invention has been made with a view toward solving the aforementioned problems. An object of the present invention is to provide a conductive laminate body, a touch panel, and a display device, in which, even if a mesh pattern is provided in which the same mesh shapes are arranged regularly, generation of moiré phenomena can be suppressed.

A conductive laminate body according to the present invention comprises a substrate, a first conductive portion made up from a plurality of thin metal wires and which is formed on one main surface of the substrate, a first protective layer disposed on the one main surface in covering relation to the first conductive portion, a second conductive portion made up from a plurality of thin metal wires and which is formed on another main surface of the substrate, and a second protective layer disposed on the other main surface in covering relation to the second conductive portion, wherein, by combining the first conductive portion and the second conductive portion, a mesh pattern is formed in which the same mesh shapes are arranged regularly as viewed in plan, and at least one of a relative index of refraction of the substrate with respect to the first protective layer and a relative index of refraction of the substrate with respect to the second protective layer is 0.86 to 1.15.

In the foregoing manner, since at least one of the relative index of refraction of the substrate with respect to the first protective layer and the relative index of refraction of the substrate with respect to the second protective layer is 0.86 to 1.15, among light that enters at a slight angle with respect to a direction normal to the substrate, the amount of light that travels in a straight line at at least one of a boundary between the substrate and the first protective layer and a boundary between the substrate and the second protective layer is increased relatively. More specifically, the amount of light that passes through the interior of the substrate without scattering increases uniformly irrespective of the position of the thin metal wires that are constituted from a non-translucent material. Consequently, contrast in optical density caused by the thin metal wires can be decreased, thus making such contrast less visible to an observer (user). In particular, with a mesh pattern in which the same mesh shapes are arranged regularly, generation of moiré phenomena can be suppressed, and thus the present invention is more effective.

Further, at least one of the relative index of refraction of the substrate with respect to the first protective layer and the relative index of refraction of the substrate with respect to the second protective layer preferably is 0.91 to 1.08.

Furthermore, at least one of the relative index of refraction of the substrate with respect to the first protective layer and the relative index of refraction of the substrate with respect to the second protective layer preferably is substantially equal to 1.

Furthermore, at least one of the first protective layer and the second protective layer preferably is made of the same material as the substrate.

Further, the substrate may be made of polyethylene terephthalate, and at least one of the first protective layer and the second protective layer preferably is made of any of polychlorotrifluoroethylene, polymethylmethacrylate, polystyrene, polyethylene terephthalate, polythiourethane, and high refractive index glass.

Moreover, the first conductive portion preferably includes at least two first conductive patterns that extend in a first direction, and are arranged in a second direction perpendicular to the first direction, the second conductive portion preferably includes at least two second conductive patterns that extend in the second direction, and are arranged in the first direction, and each of the first conductive patterns and the second conductive patterns preferably comprises a combination of at least two lattices.

Furthermore, preferably, the first conductive pattern may be constituted by connecting at least two first sensing units in series in the first direction, wherein each of the first sensing units comprises a combination of at least two of the lattices, and the second conductive pattern may be constituted by connecting at least two second sensing units in series in the second direction, wherein each of the second sensing units comprises a combination of at least two of the lattices.

Further, each of the lattices preferably is diamond-shaped, wherein vertex angles of each of the lattices are greater than or equal to 60° and less than 90°, or greater than 90° and less than or equal to 120°.

A touch panel according to the present invention comprises the conductive laminate body according to any one of the aforementioned configurations, together with a detection control unit for detecting a contact position or a proximity position from a side of a main surface of the conductive laminate body.

A display device according to the present invention comprises the conductive laminate body according to any one of the aforementioned configurations, together with a detection control unit for detecting a contact position or a proximity position from a side of a main surface of the conductive laminate body, and a display unit that displays an image on a display surface based on a display signal, wherein the conductive laminate body is disposed on the display surface.

A conductive laminate body comprises a first substrate, a first conductive portion made up from a plurality of thin metal wires and which is formed on one main surface of the first substrate, a first protective layer disposed on the one main surface of the first substrate in covering relation to the first conductive portion, a second substrate, a second conductive portion made up from a plurality of thin metal wires and which is formed on one main surface of the second substrate, and a second protective layer disposed on the one main surface of the second substrate in covering relation to the second conductive portion, wherein, by combining the first conductive portion and the second conductive portion, a mesh pattern is formed in which the same mesh shapes are arranged regularly as viewed in plan, and at least one of a relative index of refraction of the first substrate with respect to the first protective layer and a relative index of refraction of the second substrate with respect to the second protective layer is 0.86 to 1.15.

In the foregoing manner, since at least one of the relative index of refraction of the first substrate with respect to the first protective layer and the relative index of refraction of the second substrate with respect to the second protective layer is 0.86 to 1.15, among light that enters at a slight angle with respect to a direction normal to the respective substrates, the amount of light that travels in a straight line at at least one of a boundary between the first substrate and the first protective layer and a boundary between the second substrate and the second protective layer is increased relatively. More specifically, the amount of light that passes through the interior of the substrates without scattering increases uniformly irrespective of the position of the thin metal wires that are constituted from a non-translucent material. Consequently, contrast in optical density caused by the thin metal wires can be decreased, thus making such contrast less visible to an observer (user). In particular, with a mesh pattern in which the same mesh shapes are arranged regularly, generation of moiré phenomena can be suppressed, and thus the present invention is more effective.

Further, at least one of the relative index of refraction of the first substrate with respect to the first protective layer and the relative index of refraction of the second substrate with respect to the second protective layer preferably is 0.91 to 1.08.

Furthermore, at least one of the relative index of refraction of the first substrate with respect to the first protective layer and the relative index of refraction of the second substrate with respect to the second protective layer preferably is substantially equal to 1.

Furthermore, the first protective layer preferably is made of the same material as the first substrate, and/or the second protective layer preferably is made of the same material as the second substrate.

Further, preferably, the first substrate may be made of polyethylene terephthalate, and the first protective layer may be made of any of polychlorotrifluoroethylene, polymethylmethacrylate, polystyrene, polyethylene terephthalate, polythiourethane, and high refractive index glass, and/or the second substrate may be made of polyethylene terephthalate, and the second protective layer may be made of any of polychlorotrifluoroethylene, polymethylmethacrylate, polystyrene, polyethylene terephthalate, polythiourethane, and high refractive index glass.

Moreover, the first conductive portion preferably includes at least two first conductive patterns that extend in a first direction, and are arranged in a second direction perpendicular to the first direction, the second conductive portion preferably includes at least two second conductive patterns that extend in the second direction, and are arranged in the first direction; and each of the first conductive patterns and the second conductive patterns preferably comprises a combination of at least two lattices.

Furthermore, preferably, the first conductive pattern may be constituted by connecting at least two first sensing units in series in the first direction, wherein each of the first sensing units comprises a combination of at least two of the lattices, and the second conductive pattern may be constituted by connecting at least two second sensing units in series in the second direction, wherein each of the second sensing units comprises a combination of at least two of the lattices.

Further, each of the lattices preferably is diamond-shaped, wherein vertex angles of each of the lattices are greater than or equal to 60° and less than 90°, or greater than 90° and less than or equal to 120°.

A touch panel according to the present invention comprises the conductive laminate body according to any one of the aforementioned configurations, together with a detection control unit for detecting a contact position or a proximity position from a side of a main surface of the conductive laminate body.

A display device according to the present invention comprises the conductive laminate body according to any one of the aforementioned configurations, together with a detection control unit for detecting a contact position or a proximity position from a side of a main surface of the conductive laminate body, and a display unit that displays an image on a display surface based on a display signal, wherein the conductive laminate body is disposed on the display surface.

According to the conductive laminate body, the touch panel, and the display device according to the present invention, since at least one of the relative index of refraction of the substrate with respect to the first protective layer and the relative index of refraction of the substrate with respect to the second protective layer is 0.86 to 1.15, among light that enters at a slight angle with respect to a direction normal to the substrate, the amount of light that travels in a straight line at at least one of a boundary between the substrate and the first protective layer and a boundary between the substrate and the second protective layer is increased relatively. More specifically, the amount of light that passes through the interior of the substrate without scattering increases uniformly irrespective of the position of the thin metal wires that are constituted from a non-translucent material.

According to the conductive laminate body, the touch panel, and the display device according to the present invention, since at least one of the relative index of refraction of the first substrate with respect to the first protective layer and the relative index of refraction of the second substrate with respect to the second protective layer is 0.86 to 1.15, among light that enters at a slight angle with respect to a direction normal to the respective substrates, the amount of light that travels in a straight line at at least one of a boundary between the first substrate and the first protective layer and a boundary between the second substrate and the second protective layer is increased relatively. More specifically, the amount of light that passes through the interior of the substrates without scattering increases uniformly irrespective of the position of the thin metal wires that are constituted from a non-translucent material.

Consequently, contrast in optical density caused by the thin metal wires can be decreased, thus making such contrast less visible to an observer (user). In particular, with a mesh pattern in which the same mesh shapes are arranged regularly, generation of moiré phenomena can be suppressed, and thus the present invention is more effective.

The aforementioned objects and other objects, characteristics, and advantages of the present invention will become more apparent from the following descriptions of preferred embodiments, taken in conjunction with the accompanying drawings.

DESCRIPTION OF EMBODIMENTS

Below, with reference to the accompanying drawings, explanations shall be given of preferred embodiments in relation to a conductive laminate body according to the present invention, along with a touch panel and a display device in which the conductive laminate body is implemented. For facilitating explanation, cases may occur in which the term "conductive laminate body 10" is used to refer collectively to conductive laminate bodies 10A through 10C according to preferred embodiments or exemplary modifications, to be described later.

Moreover, the significance of the dash "-" to indicate numerical ranges in the present specification conveys the meaning that the numerical values appearing before and after the dash include therein lower limit numerical values and upper limit numerical values.

[Structure of Conductive Laminate Body 10A According to First Embodiment]

Figure 1:
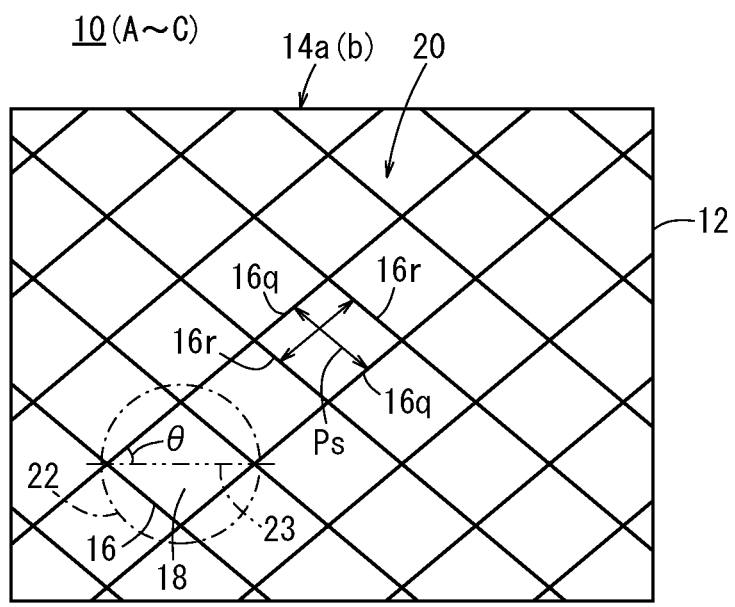
FIG. 1 is a schematic plan view showing an example of a conductive laminate body common to respective embodiments of the present invention.
Figure 1:
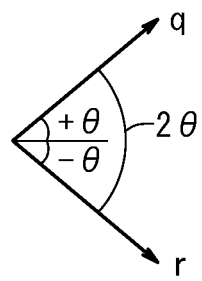
Figure 2:
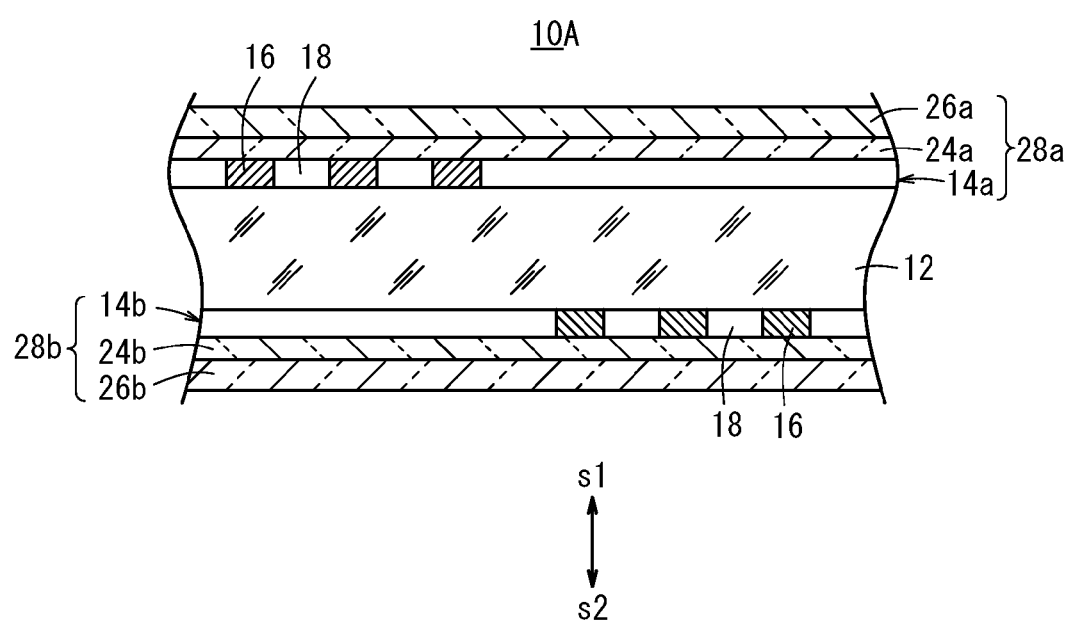
FIG. 2 is a cross sectional view with partial omission of a conductive laminate body according to a first embodiment.

As shown in FIGS. 1 and 2, a conductive laminate body 10A according to a first embodiment includes a transparent substrate 12 (substrate). The transparent substrate 12, which is highly translucent and possesses insulative properties, is made from a material such as resin, glass, silicone or the like. As suitable resins, there may be cited PET (Polyethylene Terephthalate), PMMA (Polymethyl Methacrylate), PP (Polypropylene), PS (Polystyrene), TAC (Triacetyl Cellulose), COC (Cycloolefin Copolymer), etc.

A first conductive portion 14a is formed on one main surface (a side in the direction of the arrow s1 in FIG. 2) of the transparent substrate 12. The first conductive portion 14a includes a mesh pattern 20 formed by openings 18 and thin metal wires (hereinafter referred to as thin metal wires 16, and in certain cases, also as thin metal wires 16q (16r)). The thin metal wires 16 are made from a metal material such as, for example, gold (Au), silver (Ag), copper (Cu), or the like.

The wire width of the thin metal wires 16 can be selected to be less than or equal to 30 μm. In the event that the conductive laminate body 10A is applied to a touch panel, the wire width of the thin metal wires 16 preferably is greater than or equal to 0.1 μm and less than or equal to 15 μm, more preferably, is greater than or equal to 1 μm and less than or equal to 9 μm, still more preferably, is greater than or equal to 1 μm and less than or equal to 7 μm, and still more preferably, is greater than or equal to 1 μm and less than or equal to 5 μm. The upper limit value of the wire width preferably is 5 μm, more preferably is 4 μm, and still more preferably is 3 μm. The lower limit value of the wire width preferably is 0.5 μm, more preferably is 0.8 μm, and still more preferably is 1 μm.

In particular, the first conductive portion 14a has a mesh pattern 20 in which a plurality of thin metal wires 16q, which extend in the direction of the arrow q and are arrayed at a pitch Ps in the direction of the arrow r, and a plurality of thin metal wires 16r, which extend in the direction of the arrow r and are arrayed at a pitch Ps in the direction of the arrow q intersect one another, respectively. In this case, the direction of the arrow q is inclined at an angle greater than or equal to +30° and less than or equal to +60° with respect to a reference direction (horizontal direction), and the direction of the arrow r is inclined at an angle between −30° and −60°. Consequently, any one of the mesh shapes 22 of the mesh pattern 20, i.e., the combined shape of one opening 18 and four thin metal wires 16 that surround the one opening 18 is of a diamond shape with vertex angles which are greater than or equal to 60° and less than or equal to 120°. The pitch Ps can be selected from values greater than or equal to 100 μm and less than or equal to 400 μm.

The mesh shapes 22 are not limited to the illustrated example, and may take the form of various shapes including triangular, rectangular, hexagonal, etc. The term "polygonal" implies not only polygons that are complete polygons geometrically, but also includes the meaning of "substantially polygonal" in which minor changes may be added to a complete polygonal shape. As examples of such minor changes, partial defects or the like may be introduced to each side (thin metal wires 16) constituting the mesh shapes 22, or alternatively, micro point-like or line-like elements, as compared with the illustrated mesh shapes 22, may be added to the mesh shapes 22.

A first protective layer 26a is bonded through a first adhesive layer 24a substantially over the entire surface of the first conductive portion 14a, so as to cover the first conductive portion 14a (thin metal wires 16). As suitable materials for the first adhesive layer 24a, wet laminating adhesives, dry laminating adhesives, or hot melt adhesives, etc., may be used.

Similar to the transparent substrate 12, the first protective layer 26a is made from a highly translucent material such as resin, glass, silicone or the like. The index of refraction n1 of the first protective layer 26a is of a value equivalent to the index of refraction n0 of the transparent substrate 12, or a value close to the index of refraction n0 thereof. In this case, the relative index of refraction nr1 of the transparent substrate 12 with respect to the first protective layer 26a is substantially equal to 1 (i.e., equal to 1 or of a value close to 1).

The index of refraction as used in the present specification implies an index of refraction in relation to light having a wavelength of 589.3 nm (sodium D line), and for example in the case of a resin, is defined by the international standard ISO 14782:1999 (corresponding to JIS K 7105). Further, the relative index of refraction nr1 of the transparent substrate 12 with respect to the first protective layer 26a is defined by nr1=(n1/n0). The relative index of refraction nr1 may reside within a range of being greater than or equal to 0.86 and less than or equal to 1.15, and more preferably, is greater than or equal to 0.91 and less than or equal to 1.08.

In the case that the transparent substrate 12 is made from PET, by adopting as a material for the first protective layer 26a, for example, PCTFE (Polychloro-Trifluoroethylene), PMMA, PS, PET, PTU (Polythiourethane), or high refractive index glass, etc., the above relationship concerning the index of refraction can be satisfied. The same applies to a second protective layer 26b, to be described later.

Hereinbelow, respective parts (including the first conductive portion 14a, the first adhesive layer 24a, and the first protective layer 26a) that are formed on the one main surface (the side in the direction of the arrow s1 in FIG. 2) of the transparent substrate 12 may also be referred to collectively as a first stacked portion 28a.

Incidentally, a second conductive portion 14b is formed on another main surface (a side in the direction of the arrow s2 in FIG. 2) of the transparent substrate 12. The second conductive portion 14b includes a mesh pattern 20 formed by openings 18 and thin metal wires 16, in the same manner as the first conductive portion 14a.

A second protective layer 26b is bonded through a second adhesive layer 24b substantially over the entire surface of the second conductive portion 14b, so as to cover the second conductive portion 14b (thin metal wires 16). The material of the second adhesive layer 24b may be the same material or a different material from that of the first adhesive layer 24a. Also, the material of the second protective layer 26b may be the same material or a different material from that of the first protective layer 26a.

The index of refraction n2 of the second protective layer 26b is equal to or is near to the value of the index of refraction n0 of the transparent substrate 12. In this case, the relative index of refraction nr2 of the transparent substrate 12 with respect to the second protective layer 26b is substantially equal to 1 (i.e., equal to 1 or of a value close to 1). Herein, the definitions of the index of refraction and relative index of refraction are the same as described above. Further, the relative index of refraction nr2 of the transparent substrate 12 with respect to the second protective layer 26b is defined by nr2=(n2/n0). The relative index of refraction nr2 may reside within a range of being greater than or equal to 0.86 and less than or equal to 1.15, and more preferably, is greater than or equal to 0.91 and less than or equal to 1.08.

Hereinbelow, respective parts (including the second conductive portion 14b, the second adhesive layer 24b, and the second protective layer 26b) that are formed on the other main surface (the side in the direction of the arrow s2 in FIG. 2) of the transparent substrate 12 may also be referred to collectively as a second stacked portion 28b.

The conductive laminate body 10 is applied, for example, to a touch panel of a display unit 30. The display unit 30 may be constituted by a liquid crystal panel, a plasma panel, an organic EL (Electro-Luminescence) panel, an inorganic EL panel, or the like.

Figure 3:
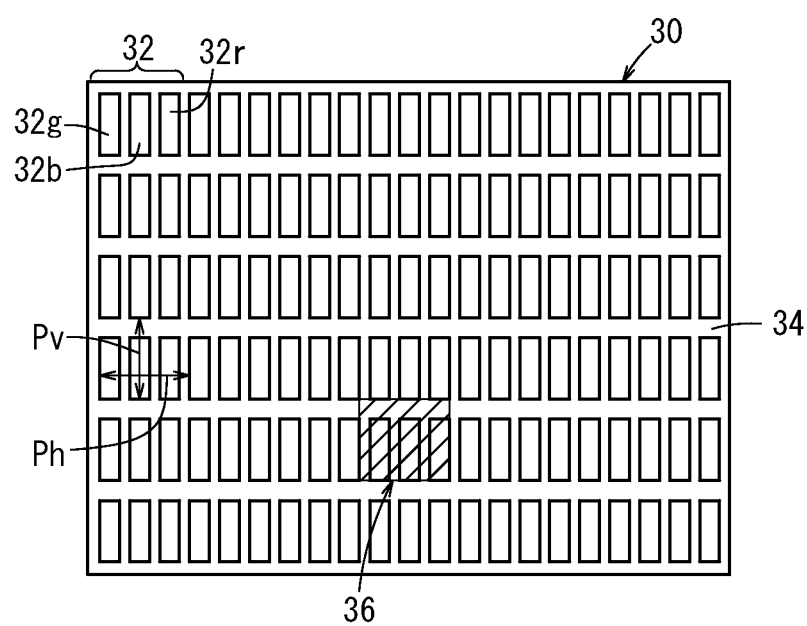
FIG. 3 is an outline schematic diagram showing a pixel arrangement of a display unit.

As shown with partial omission in FIG. 3, the display unit 30 is composed of a plurality of pixels 32 which are arranged in the form of a matrix. One pixel 32 is constituted by three sub-pixels (red sub-pixel 32r, blue sub-pixel 32b, and green sub-pixel 32g), which are arranged in the horizontal direction. One sub-pixel is of a vertically-long rectangular shape. The arrangement pitch of the pixels 32 in the horizontal direction (horizontal pixel pitch Ph) and the arrangement pitch of the pixels 32 in the vertical direction (vertical pixel pitch Pv) are substantially the same. Stated otherwise, the shape (refer to the shaded region 36) in which the one pixel 32 and a black matrix 34 (light-blocking member) surrounding the one pixel 32 are constituted is of a substantially square shape. Further, an aspect ratio of the one pixel 32 is not 1, but rather, the length in the horizontal direction (width) is greater than the length in the vertical direction (height).

As shown in FIG. 1, in the conductive laminate body 10, the angle θ defined between an imaginary line 23, which links respective plural intersection points of the mesh pattern 20 in the horizontal direction, and the thin metal wires 16 is greater than or equal to 30° and less than or equal to 60°. In addition, a case is considered in which the conductive laminate body 10 is disposed on a display panel of the display unit 30 having the aforementioned pixel arrangement.

Figure 4:
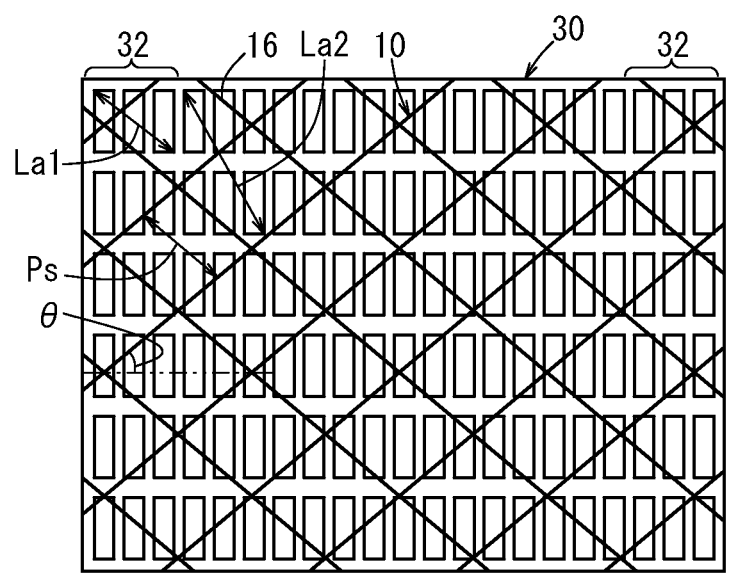
FIG. 4 is an outline schematic diagram showing an example in which the conductive laminate body of FIG. 1 is disposed on the display unit of FIG. 3.
Figure 4:
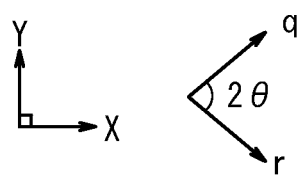

As shown in FIG. 4, the thin metal wires 16 are disposed at an inclination of 30°-60° with respect to the horizontal array direction (arrangement in the direction of the arrow X) of the pixels 32 in the display unit 30. Further, the pitch Ps in the conductive laminate body 10, and a diagonal length La1 of one pixel 32 of the display unit 30 (or alternatively, a diagonal length La2 of two pixels 32 that are adjacent in the direction of the arrow Y) are substantially of the same value or of values in proximity to each other. Furthermore, the array direction of the thin metal wires 16 in the conductive laminate body 10, and the direction of the diagonal line of one pixel 32 of the display unit 30 (or alternatively, the diagonal line of two pixels 32 that lie adjacently in the direction of the arrow Y) are substantially the same or in proximity to each other. As a result, shifting or misalignment in the arrangement period of the thin metal wires 16 and the arrangement period of the pixels 32 is minimized, thus enabling the occurrence of moiré phenomena to be suppressed.

[Structure of Display Device 40 Incorporating Conductive Laminate Body 10A]

Next, with reference to FIGS. 5 through 10, a description shall be given concerning the display device 40 in which the conductive laminate body 10A according to the first embodiment is incorporated. An example of a projection-capacitive type of touch panel will be presented. Further, the conductive laminate bodies 10B, 10C according to other embodiments can also be incorporated in a similar manner in the display device 40.

Figure 5:
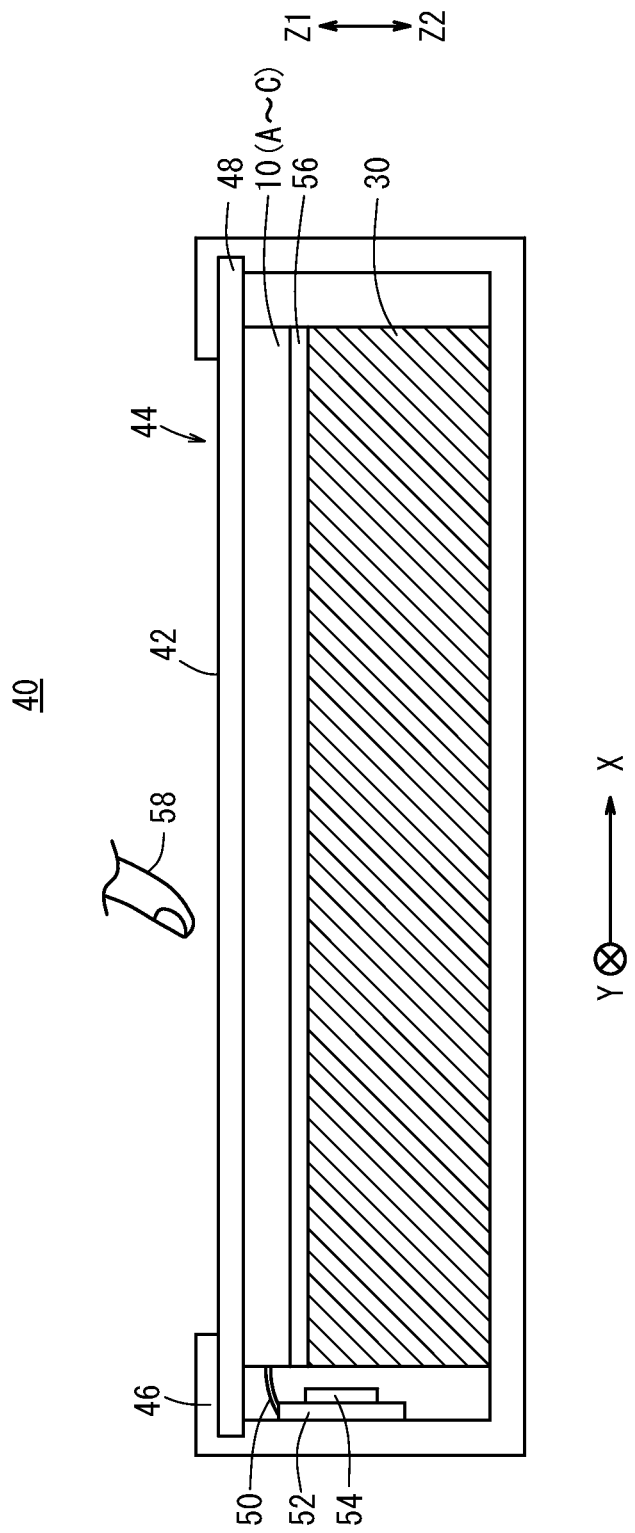
FIG. 5 is a schematic cross sectional view of a display device in which the conductive laminate body of FIG. 2 is incorporated.

As shown in FIG. 5, the display device 40 includes a display unit 30 (see FIG. 3 and FIG. 4) which is capable of displaying at least one of color and monochromatic images, a touch panel 44 that detects a contact position from an input surface 42 (on a side in the direction of the arrow Z1), and a casing 46 that accommodates the display unit 30 and the touch panel 44 therein. A user is capable of accessing the touch panel 44 through a large opening that is provided on one surface (on the side in the direction of the arrow Z1) of the casing 46.

The touch panel 44 comprises, apart from the aforementioned conductive laminate body 10 (see FIG. 1 and FIG. 2), a cover member 48 that is stacked on one surface (on a side in the direction of the arrow Z1) of the conductive laminate body 10A, a flexible substrate 52 connected electrically via a cable 50 to the conductive laminate body 10A, and a detection control unit 54 disposed on the flexible substrate 52.

On one surface (the side in the direction of the arrow Z1) of the display unit 30, the conductive laminate body 10 is bonded through an adhesive layer 56. From the standpoint of suppressing moiré phenomena, the display unit 30 and the conductive laminate body 10A have a positional relationship as shown in FIG. 4.

The cover member 48 functions as an input surface 42 while covering one surface of the conductive laminate body 10A. Further, by preventing direct contact with a contact body 58 (e.g., a finger or a stylus), the cover member 48 is capable of suppressing abrasion, adherence of dust, etc., thereby enabling the conductivity of the conductive laminate body 10A to remain stable.

The material of the cover member 48 may be glass or a resin film, for example. Under a condition in which one surface (on the side in the direction of the arrow Z2) of the cover member 48 is coated with silicon oxide or the like, the one surface of the conductive laminate body 10A (on the side in the direction of the arrow Z1) may be placed in intimate contact firmly against the cover member 48. Further, for preventing damage due to rubbing or the like, the conductive laminate body 10A and the cover member 48 may be adhered to one another by bonding.

The flexible substrate 52 is an electronic substrate equipped with flexibility. In the illustrated example, although the flexible substrate 52 is fixed to an inner wall side surface of the casing 46, the position at which the flexible substrate 52 is arranged may be changed in various ways. The detection control unit 54 comprises an electric circuit for detecting a contact position (or a proximate position) of the contact body 58, which acts as a conductor, in a case where the contact body 58 comes into contact (or into proximity) with the input surface 42.

Figure 6A:
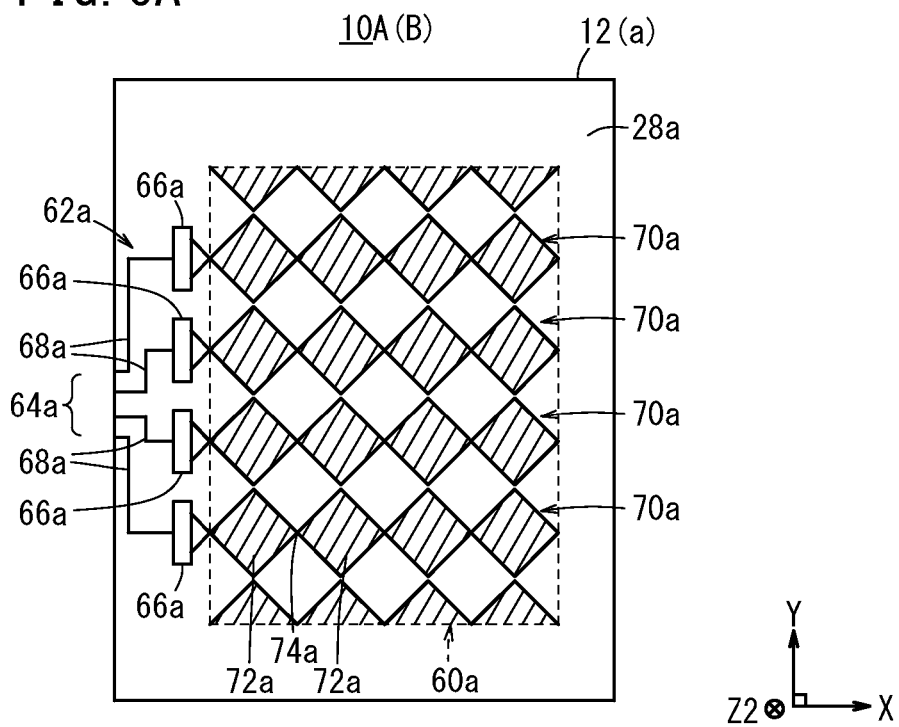
FIG. 6A is a plan view showing an example pattern of a first stacked portion shown in FIG. 2.

As shown in FIG. 6A, on the first stacked portion 28a of the conductive laminate body 10A, on a side in the direction of the arrow Z2 as viewed in plan, there are provided a first sensor part 60a, which is disposed in the display area of the display unit 30 (see FIGS. 3 through 5), and first terminal wire parts 62a (a so-called frame), which are disposed on an outer peripheral region of the display area.

The appearance and shape of the first stacked portion 28a is rectangular as viewed in plan, and the appearance and shape of the first sensor part 60a is similarly rectangular. Among the first terminal wire parts 62a, on a peripheral edge portion of the first stacked portion 28a on one side thereof parallel to the direction of the arrow Y, on a central portion in the lengthwise direction thereof, plural first terminals 64a are arrayed in the direction of the arrow Y. Along one side of the first sensor part 60a (a side parallel to the direction of the arrow Y in the illustrated example), plural first wire connectors 66a are arrayed in a line. First terminal wire patterns 68a, which are led out from the respective first wire connectors 66a, are routed toward the first terminals 64a of the first stacked portion 28a, and are connected electrically to respective corresponding first terminals 64a.

A site corresponding to the first sensor part 60a includes two or more first conductive patterns 70a (mesh patterns) formed by a plurality of thin metal wires 16 (see FIG. 1). The first conductive patterns 70a extend respectively in a direction (first direction) of the arrow X, and are arranged in a direction (second direction) of the arrow Y perpendicular to the direction of the arrow X. Further, each of the first conductive patterns 70a is constituted by connection of two or more first large lattices 72a (first sensing units) in series in the direction of the arrow X. Between adjacent first large lattices 72a, first connectors 74a are formed that connect electrically the first large lattices 72a.

On one end side of each of the first conductive patterns 70a, the first connectors 74a are not formed on open ends of the first large lattices 72a. On the other end side of each of the first conductive patterns 70a, the first wire connectors 66a are provided respectively on ends of the first large lattices 72a. In addition, each of the first conductive patterns 70a is connected electrically via the respective first wire connectors 66a to the first terminal wire patterns 68a.

Figure 7:
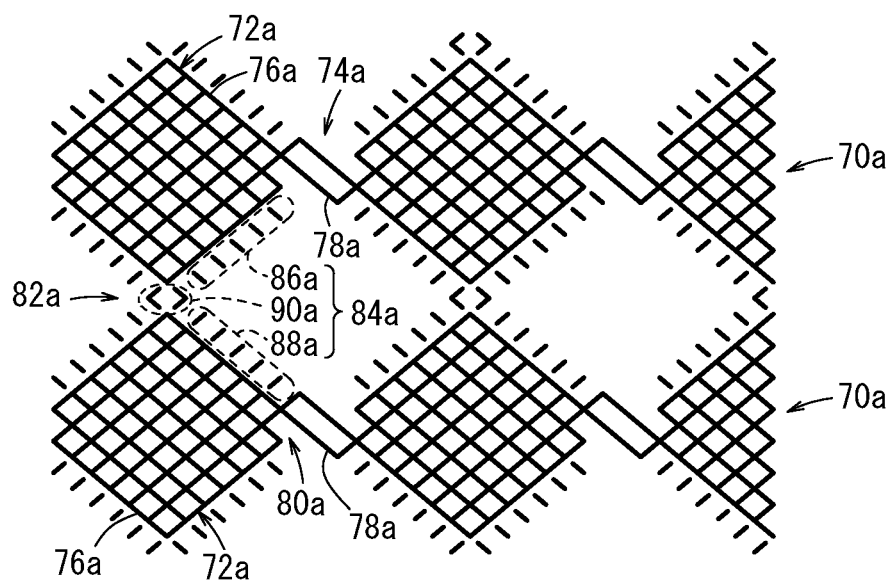
FIG. 7 is a partially enlarged plan view of a first sensor part of FIG. 6A.

As shown in FIG. 7, each of the first large lattices 72a is constituted by combining at least two first small lattices 76a (lattices). The shape of each first small lattice 76a in this case is the smallest diamond shape, which is the same or similar to the aforementioned one mesh shape 22 (see FIG. 1). First connectors 74a, which are connected between adjacent first large lattices 72a, are constituted from first intermediate lattices 78a, each having an area greater than or equal to that of the first small lattice 76a and smaller than that of the first large lattice 72a.

Among the sides of the first large lattices 72a along the direction of the arrow q, a portion thereof adjacent to the first intermediate lattice 78a has a first cutoff part 80a, which is cut off from a side of one of the first small lattices 76a. In the illustrated example, the first intermediate lattice 78a is of a size capable of allowing three first small lattices 76a to be arranged therein in the direction of the arrow r.

Further, electrically insulated first insulating portions 82a are provided, respectively, between the adjacent first conductive patterns 70a.

Surrounding each of the first conductive patterns 70a, plural first auxiliary patterns 84a made up from multiple thin metal wires 16 (see FIG. 1) are arranged respectively. The first auxiliary patterns 84a are made up from plural first auxiliary wires 86a, which are arranged along a side parallel to the direction of the arrow q among sides of the first large lattice 72a, plural first auxiliary wires 88a, which are arranged along a side parallel to the direction of the arrow r among sides of the first large lattice 72a, and a pattern in which there are disposed in confronting relation two first L-shaped patterns 90a, in which two of the first auxiliary wires 86a, 88a are combined respectively in an L-shape.

Figure 6B:
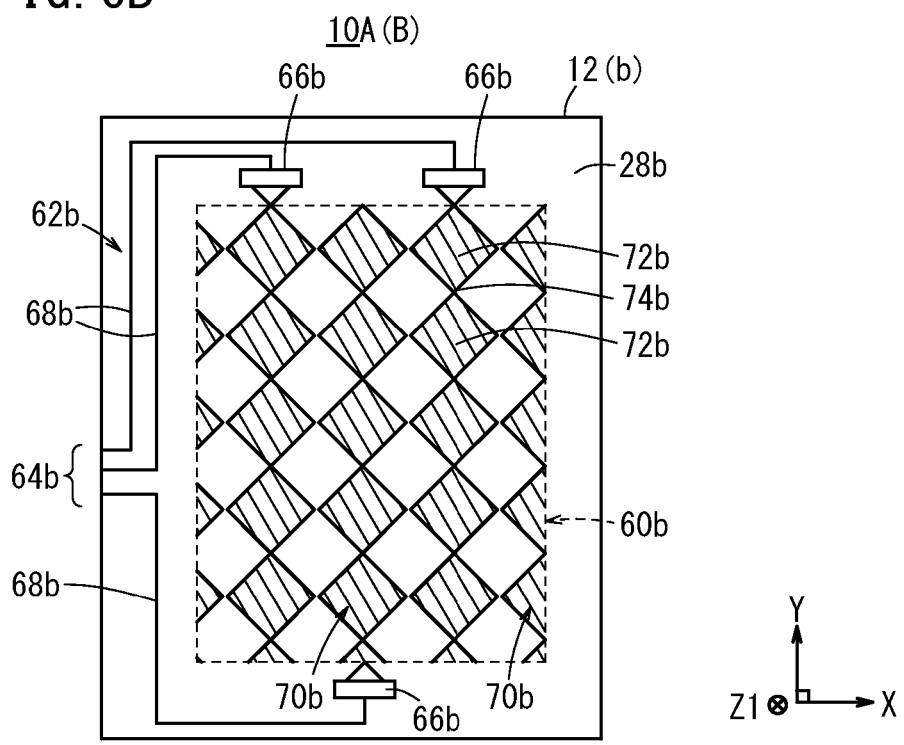
FIG. 6B is a plan view showing an example pattern of a second stacked portion shown in FIG. 2.

On the other hand, as shown in FIG. 6B, on the second stacked portion 28b of the conductive laminate body 10A, on a side in the direction of the arrow Z1 as viewed in plan, there are provided a second sensor part 60b, which is disposed in the display area of the display unit 30 (see FIGS. 3 through 5), and second terminal wire parts 62b (a so-called frame), which are disposed on an outer peripheral region of the display area.

The appearance and shape of the second stacked portion 28b is rectangular as viewed in plan, and the appearance and shape of the second sensor part 60b also is rectangular. Among the second terminal wire parts 62b, on a peripheral edge portion of the second stacked portion 28b on one side thereof parallel to the direction of the arrow Y, on a central portion in the lengthwise direction, plural second terminals 64b are arrayed in the direction of the arrow Y. Along one side of the second sensor part 60b (a side parallel to the direction of the arrow X in the illustrated example), plural second wire connectors 66b (e.g., odd-numbered second wire connectors 66b) are arrayed in a line. Along the other side of the second sensor part 60b (a side opposite to the aforementioned one side), plural second wire connectors 66b (e.g., even-numbered second wire connectors 66b) are arranged in a line. Second terminal wire patterns 68b, which are led out from the respective second wire connectors 66b, are routed toward the second terminals 64b of the second stacked portion 28b, and are connected electrically to respective corresponding second terminals 64b.

A site corresponding to the second sensor part 60b includes two or more second conductive patterns 70b (mesh patterns) formed by a plurality of thin metal wires 16 (see FIG. 1). The second conductive patterns 70b extend respectively in a direction (second direction) of the arrow Y, and are arrayed in a direction (first direction) of the arrow X perpendicular to the direction of the arrow Y. Each of the second conductive patterns 70b is constituted by connection of two or more second large lattices 72b (second sensing units) in series in the direction of the arrow Y. Between adjacent second large lattices 72b, second connectors 74b are formed that electrically connect the second large lattices 72b.

On one end side of each of the second conductive patterns 70b, the second connectors 74b are not formed on open ends of the second large lattices 72b. On the other end side of each of the second conductive patterns 70b, the second wire connectors 66b are provided respectively on ends of the second large lattices 72b. In addition, each of the second conductive patterns 70b is connected electrically via the second wire connector 66b to the second terminal wire pattern 68b.

Figure 8:
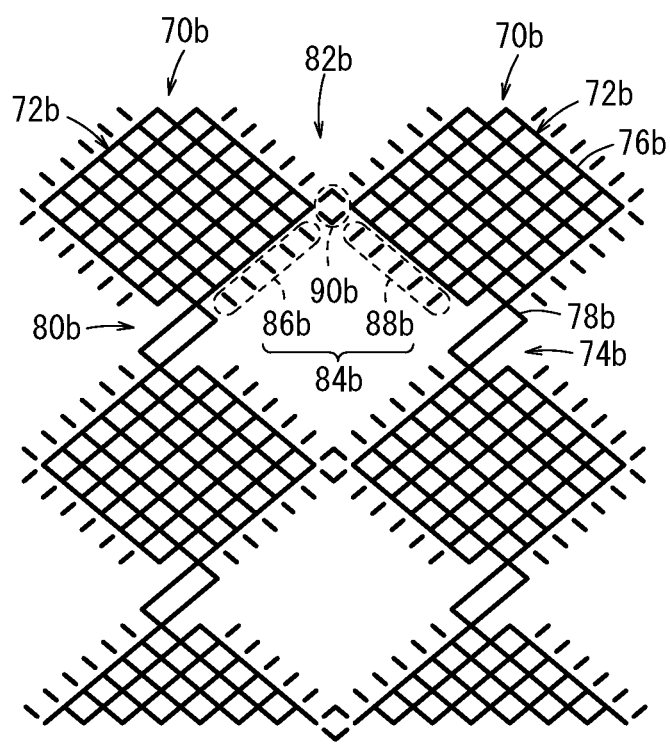
FIG. 8 is a partially enlarged plan view of a second sensor part of FIG. 6B.
Figure 8:
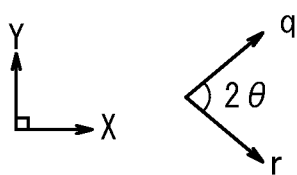

As shown in FIG. 8, each of the second large lattices 72b is constituted by combining at least two second small lattices 76b (lattices). The shape of each second small lattice 76b in this case is the smallest diamond shape, which is the same or similar to the aforementioned one mesh shape 22 (see FIG. 1). Second connectors 74b, which are connected between adjacent second large lattices 72b, are constituted from second intermediate lattices 78b, each having an area greater than or equal to that of the second small lattice 76b and smaller than that of the second large lattice 72b.

Among the sides of the second large lattices 72b along the direction of the arrow q, a portion thereof adjacent to the second intermediate lattice 78b has a second cutoff part 80b, which is cut off from a side of one of the second small lattices 76b. In the illustrated example, the second intermediate lattice 78b is of a size capable of allowing three second small lattices 76b to be arranged therein in the direction of the arrow q.

Further, electrically insulated second insulating portions 82b are provided, respectively, between the adjacent second conductive patterns 70b.

Surrounding each of the second conductive patterns 70b, plural second auxiliary patterns 84b made up from multiple thin metal wires 16 (see FIG. 1) are arranged respectively. The second auxiliary patterns 84b are made up from plural second auxiliary wires 86b, which are arranged along a side parallel to the direction of the arrow q among sides of the second large lattice 72b, plural second auxiliary wires 88b, which are arranged along a side parallel to the direction of the arrow r among sides of the second large lattice 72b, and a pattern in which there are disposed in confronting relation two second L-shaped patterns 90b, in which two of the second auxiliary wires 86b, 88b are combined respectively in an L-shape.

Figure 9:
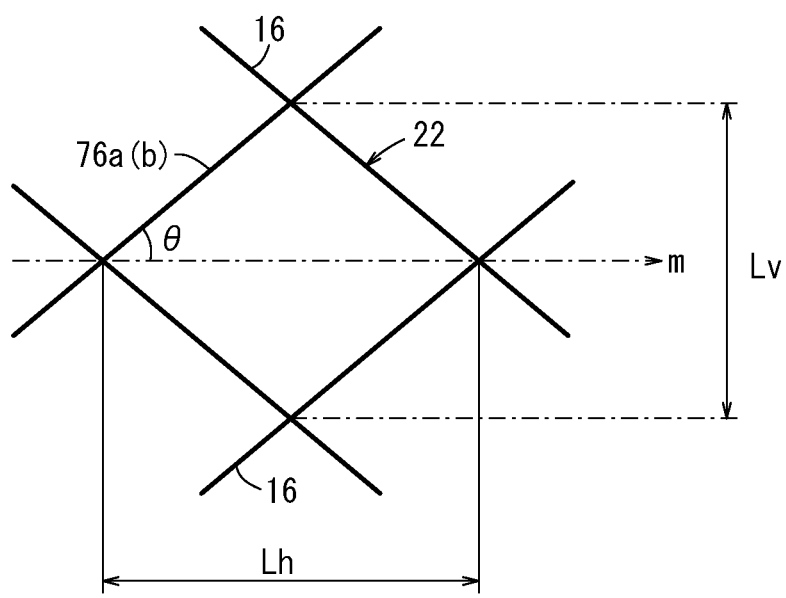
FIG. 9 is a schematic diagram showing external characteristics of a first small lattice of FIG. 7 and a second small lattice of FIG. 8.
Figure 9:

FIG. 9 is a schematic diagram showing external characteristics of the first small lattice 76a of FIG. 7 and the second small lattice 76b of FIG. 8.

The first small lattices 76a and the second small lattices 76b are the smallest of the diamond shapes, and are of the same shape or of a similar shape to the aforementioned one mesh shape 22 (see FIG. 1, etc.). In the first small lattices 76a and the second small lattices 76b, the angle θ formed between at least one side and the first direction (m direction) is set to 30°-60°. Under a condition of the arrangement of the touch panel 44, in the case that the m direction coincides with the direction in which the pixels of the display unit 30

(see FIG. 4) are arrayed, the aforementioned angle θ is set to 30°-44° or 46°-60°, and more preferably 32°-39° or to 51°-58°.

Further, "Lv" defines a length of the diagonal line (one diagonal line) in relation to the vertical direction of the first small lattice 76a and the second small lattice 76b, and "Lh" defines a length of the diagonal line (another diagonal line) in relation to the horizontal direction thereof. At this time, the aspect ratio (Lv/Lh) of the first small lattice 76a and the second small lattice 76b is set to satisfy the following relationship.

$$0.57 < Lv/Lh < 1.74$$

Under a condition of the arrangement of the touch panel 44, in the case that the m direction coincides with the direction in which the pixels of the display unit 30 (see FIG. 4) are arrayed, the aforementioned aspect ratio (Lv/Lh) is set to satisfy the inequality 0.57<Lv/Lh<1.00 or to satisfy the inequality 1.00<Lv/Lh<1.74, and more preferably, is set to satisfy the inequality 0.62<Lv/Lh<0.81 or to satisfy the inequality 1.23<Lv/Lh<1.61.

Figure 10:
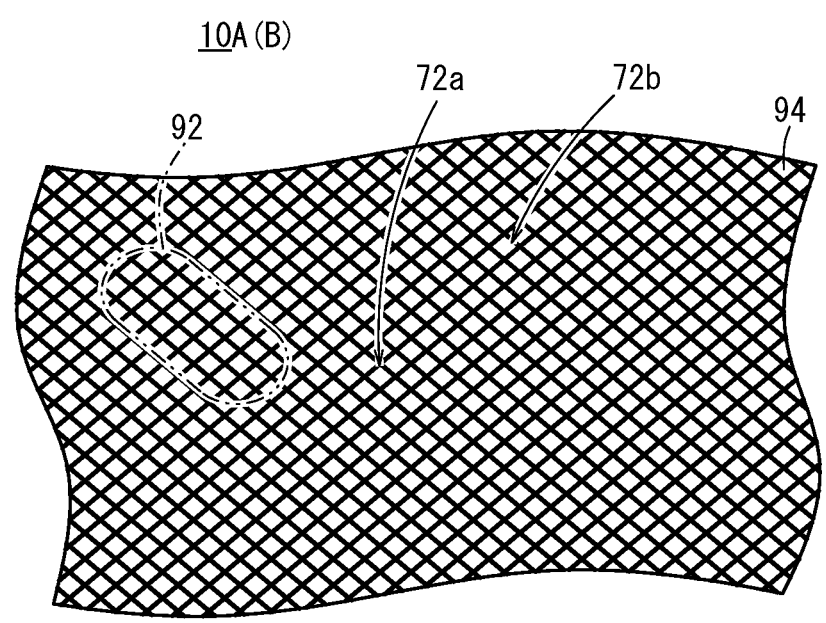
FIG. 10 is a schematic plan view showing a conductive laminate body in a condition in which a first conductive portion and a second conductive portion are combined.

As shown in FIG. 10, in a plan view of the conductive laminate body 10A comprising the first sensor part 60a and the second sensor part 60b, a configuration is provided in which the second large lattices 72b of the second stacked portion 28b are arranged in an embedded manner in interspaces of the first large lattices 72a, which are formed on the first stacked portion 28a. At this time, by the confronting arrangement of the first auxiliary patterns 84a and the second auxiliary patterns 84b, combined patterns 92 are formed in the interspaces between the first large lattices 72a and the second large lattices 72b. The combined patterns 92 are of a form in which at least one of the first small lattices 76a (mesh shapes) and at least one of the second small lattices 76b (mesh shapes) are combined. As a result, in a case where the conductive laminate body 10 is viewed in plan, a form is brought about in which multiple small lattices 94 (mesh shapes) are spread all over.

The length of one side of the first large lattices 72a (and the second large lattices 72b) preferably is 3-10 mm, and more preferably, is 4-6 mm. In the case that the average length of the one side is less than the aforementioned lower limit value and the conductive laminate body 10 is applied to a touch panel, since the detected electrostatic capacitance of the first large lattices 72a (and the second large lattices 72b) decreases, the possibility for detection failures to occur increases. On the other hand, if the aforementioned upper limit value is exceeded, the detection precision of the contact position tends to decrease. From the same standpoint, as noted above, the length of one side of the small lattices 94 (first small lattice 76a, second small lattice 76b) preferably is 100-400 μm, more preferably, is 150-300 μm, and most preferably, is 210-250 μm. In the case that the sides of the small lattices 94 are within the aforementioned ranges, transparency can be more suitably maintained, and the display screen can be viewed without discomfort in a case where the conductive laminate body is attached to the front of the display unit 30.

[Conductive Laminate Body 10B According to Second Embodiment]

Figure 11:
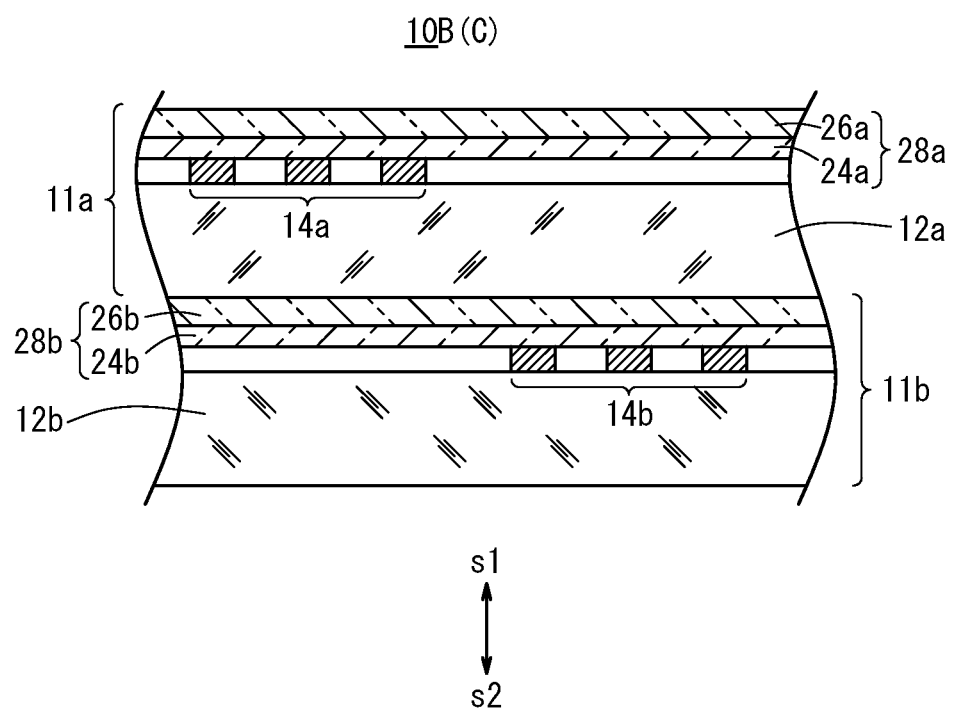
FIG. 11 is a cross sectional view with partial omission of a conductive laminate body according to a second embodiment.

Next, a description shall be made with reference to FIG. 11, etc., concerning the structure of a conductive laminate body 10B according to a second embodiment. FIG. 11 is a cross sectional view with partial omission of a conductive laminate body 10B according to a second embodiment.

Below, constituent elements that exhibit the same functions as those according to the conductive laminate body 10A are denoted using the same reference characters and detailed description of such features is omitted. The same applies to other embodiments and modifications to be described later.

As shown in FIG. 11, the conductive laminate body 10B is constituted by stacking in order from below a second sheet member 11b and a first sheet member 11a. The first sheet member 11a includes a first transparent substrate 12a (first substrate), and the second sheet member 11b includes a second transparent substrate 12b (second substrate). The first transparent substrate 12a and the second transparent substrate 12b possess insulative properties, and are made from a highly-translucent material such as resin, glass, silicone or the like. As suitable resins, there may be cited PET, PMMA, PP, PS, TAC, etc.

The first sheet member 11a includes a first conductive portion 14a formed on one main surface (on a side in the direction of the arrow s1) of the first transparent substrate 12a. A first protective layer 26a is bonded through a first adhesive layer 24a substantially over the entire surface of the first conductive portion 14a, so as to cover the thin metal wires 16. In a case where the relative index of refraction of the transparent substrate 12a with respect to the first protective layer 26a is defined as nr1, similar to the first embodiment, the relative index of refraction nr1 may reside within a range of being greater than or equal to 0.86 and less than or equal to 1.15, and more preferably, is greater than or equal to 0.91 and less than or equal to 1.08.

The second sheet member 11b includes a second conductive portion 14b formed on one main surface (on a side in the direction of the arrow s1) of the second transparent substrate 12b. A second protective layer 26b is bonded through a second adhesive layer 24b substantially over the entire surface of the second conductive portion 14b, so as to cover the thin metal wires 16. In a case where the relative index of refraction of the transparent substrate 12 with respect to the second protective layer 26b is defined as nr2, similar to the first embodiment, the relative index of refraction nr2 may reside within a range of being greater than or equal to 0.86 and less than or equal to 1.15, and more preferably, is greater than or equal to 0.91 and less than or equal to 1.08.

In the foregoing manner, the conductive laminate body 10B includes the first transparent substrate 12a, the first conductive portion 14a made up from a plurality of thin metal wires 16 formed on one main surface of the first transparent substrate 12a, the first protective layer 26a disposed on the one main surface of the first transparent substrate 12a in covering relation to the first conductive portion 14a, the second transparent substrate 12b, the second conductive portion 14b made up from a plurality of thin metal wires 16 formed on one main surface of the second transparent substrate 12b, and the second protective layer 26b disposed on the one main surface of the second transparent substrate 12b in covering relation to the second conductive portion 14b.

On the one main surface side of the first transparent substrate 12a, a first sensor part 60a, which is the same as that of the first embodiment, is provided (see FIG. 6A and FIG. 7). Further, on the one main surface side of the second transparent substrate 12b, a second sensor part 60b, which is the same as that of the first embodiment, is provided (see FIG. 6B and FIG. 8).

Provided in this manner, as shown in FIG. 10, in a case where the conductive laminate body 10B comprising the first sensor part 60a and the second sensor part 60b is viewed in plan, a condition is brought about in which plural small lattices 94 (mesh shapes) are spread all over.

In the foregoing manner, if the conductive laminate body 10B is constituted as described above, the same advantages as those of the first embodiment can be obtained. Moreover, another layer (for example, an adhesive layer) may be interposed between the first sheet member 11a and the second sheet member 11b. Further, if kept in an insulated state, the first conductive portion 14a and the second conductive portion 14b can be disposed in confronting relation to each other.

[First Sensor Part 60c and Second Sensor Part 60d According to Modification]

Figure 12A:
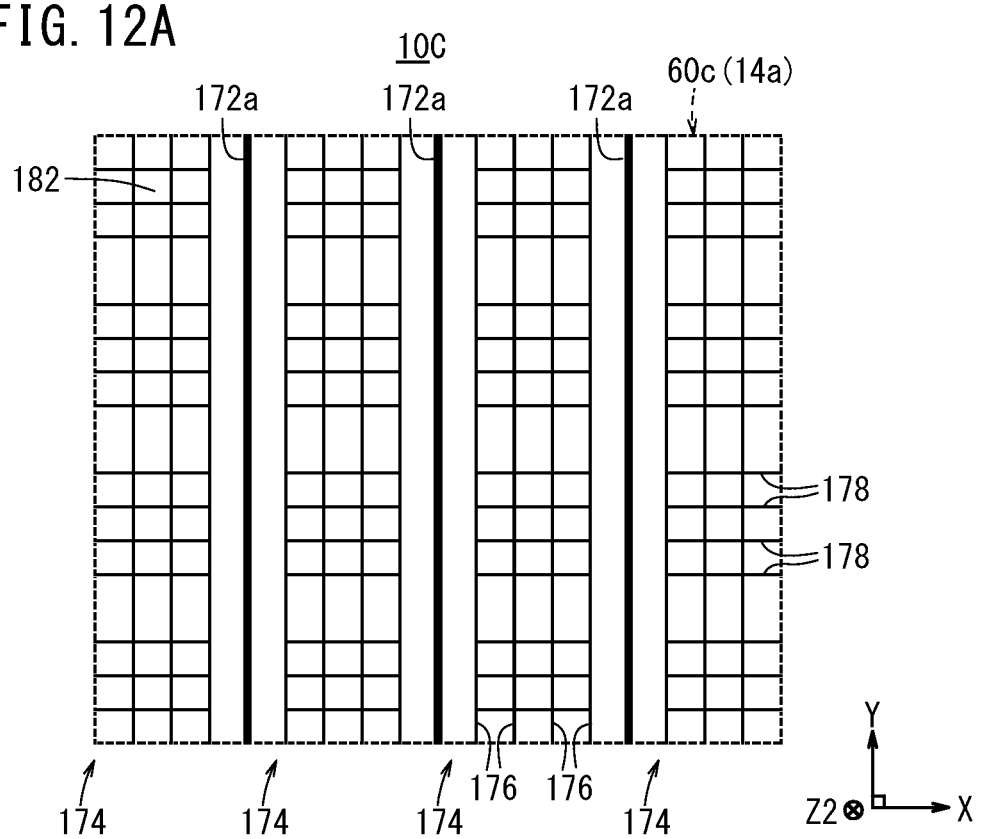
FIG. 12A is a partially enlarged plan view of a first sensor part according to a modification thereof.
Figure 12B:
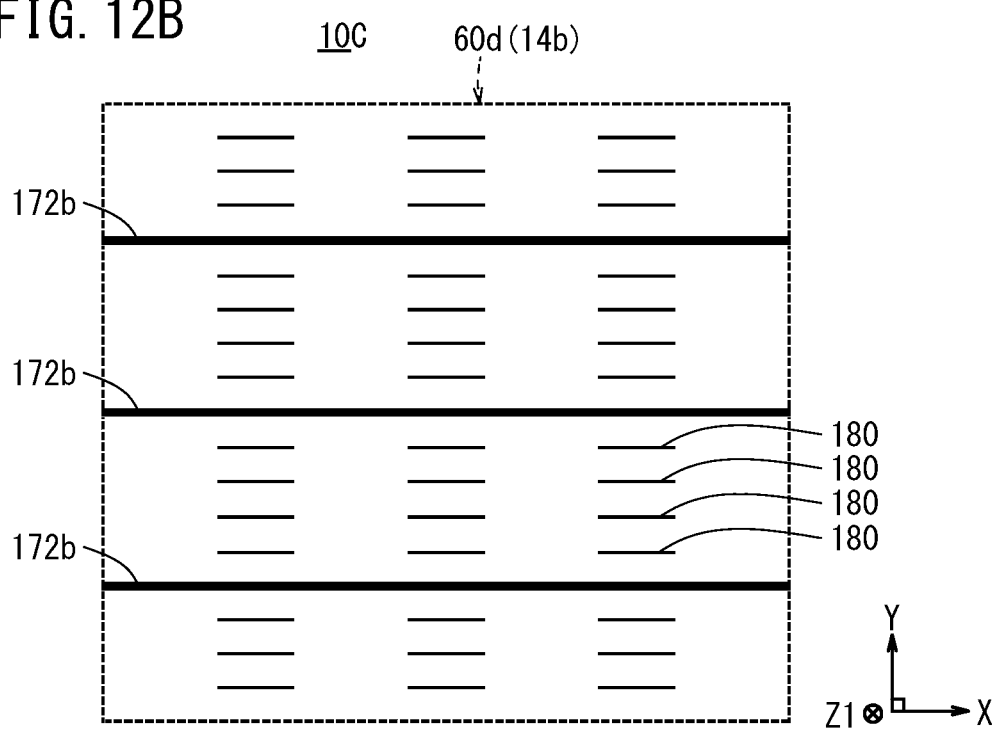
FIG. 12B is a partially enlarged plan view of a second sensor part according to a modification thereof.

Next, a description will be made, with reference to FIG. 12A and FIG. 12B, concerning the structure of a first sensor part 60c and a second sensor part 60d according to a modification of the second embodiment. FIG. 12A is a plan view showing a different pattern example of the first stacked portion 28a shown in FIG. 11. FIG. 12B is a plan view showing a different pattern example of the second stacked portion 28b shown in FIG. 11.

In FIG. 12A and FIG. 12B, for facilitating explanation, only an outline of the mesh pattern 20 formed by multiple thin metal wires 16, is denoted by single lines. More specifically, if portions of each of the single lines shown in FIG. 12A and FIG. 12B were enlarged, the structure of the mesh pattern 20 shown in FIG. 1 would become apparent.

As shown in FIG. 12A, at a site corresponding to the first sensor part 60c, two or more first conductive patterns 172a formed by multiple thin metal wires 16 are included. The first conductive patterns 172a extend respectively in the direction of the arrow Y, and are arranged at equal intervals in the direction of the arrow X perpendicular to the direction of the arrow Y. Further, the first conductive patterns 172a differ from the second conductive patterns 70b (see FIG. 6B, etc.) and are strip shaped patterns having substantially constant widths. Lattice-shaped first dummy patterns 174 are disposed respectively between each of the first conductive patterns 172a. The first dummy patterns 174 are constituted from four elongate line patterns 176 that extend in the direction of the arrow Y and are arranged at equal intervals, and a plurality of short line patterns 178 disposed perpendicularly to the four elongate line patterns 176, respectively. The respective short line patterns 178 are of the same length, repeated in units of four each, which are arrayed at equal intervals with respect to the direction of the arrow Y.

As shown in FIG. 12B, at a site corresponding to the second sensor part 60d, two or more second conductive patterns 172b formed by multiple thin metal wires 16 are included. The second conductive patterns 172b extend respectively in the direction of the arrow X, and are arranged at equal intervals in the direction of the arrow Y perpendicular to the direction of the arrow X. Further, the second conductive patterns 172b differ from the first conductive patterns 70a (see FIG. 6A, etc.) and are strip shaped patterns having substantially constant widths. Straight line shaped second dummy patterns 180, which extend in the direction of the arrow X, are arranged in plurality between each of the second conductive patterns 172b. The respective second dummy patterns 180 are of the same length, repeated in units of four each, which are arrayed at equal intervals with respect to the direction of the arrow Y.

More specifically, as viewed in plan, by mutually complementing the patterns, which are formed by the first sensor part 60c (see FIG. 12A) and the second sensor part 60d (see FIG. 12B), a lattice shape pattern is formed with one lattice element 182 as one unit. If constructed in this manner, the same advantages as those of the second embodiment can be obtained. Moreover, it goes without saying that the first sensor part 60c and the second sensor part 60d can be applied to the first embodiment.

[Mechanism for Improving Visibility of the Conductive Laminate Body 10]

Next, with reference to FIGS. 13A through 14B, an explanation shall be given concerning advantages and effects obtained by maintaining the relative index of refraction nr1 of the transparent substrate 12 with respect to the first protective layer 26a in the vicinity of 1. To facilitate understanding, parts of the structure of the conductive laminate body 10 are omitted, and only the transparent substrate 12, the first conductive portion 14a, and the first protective layer 26a are denoted.

Figure 13A:
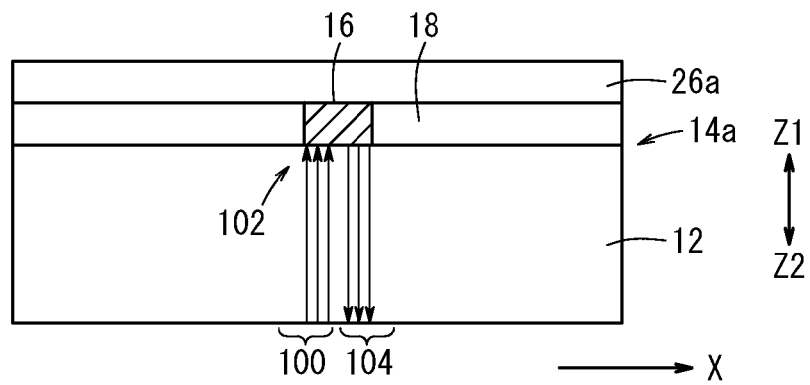
FIG. 13A is an outline schematic diagram showing paths of parallel light which are irradiated toward thin metal wires.

As shown in FIG. 13A, parallel light 100, which is irradiated from the side of the display unit 30 (see FIG. 5, etc.), enters into the interior of the transparent substrate 12 and travels in straight lines in the direction of the arrow Z1. In addition, at a first interface 102 between the transparent substrate 12 and the thin metal wires 16, the parallel light 100 is reflected as a reflected light component 104 substantially completely in the direction of the arrow Z2. More specifically, corresponding to the presence or absence of the thin metal wires 16, which are formed from a non-translucent material, the difference in the amount of light that is transmitted through the conductive laminate body 10 is large. As a result, shading becomes significant responsive to the shape of the mesh pattern 20, making it easy for moiré phenomena to be generated. In contrast thereto, in the case of a conductive laminate body that uses a translucent conductive material (typically, ITO), the above described effect virtually is not imparted.

Next, an optical phenomenon that occurs in the case that the difference in the index of refraction between the transparent substrate 12 and the first protective layer 26a is large, i.e., in the event that the relative index of refraction nr1 is far from the value 1, will be explained with reference to FIG. 13B and FIG. 13C.

Figure 13B:
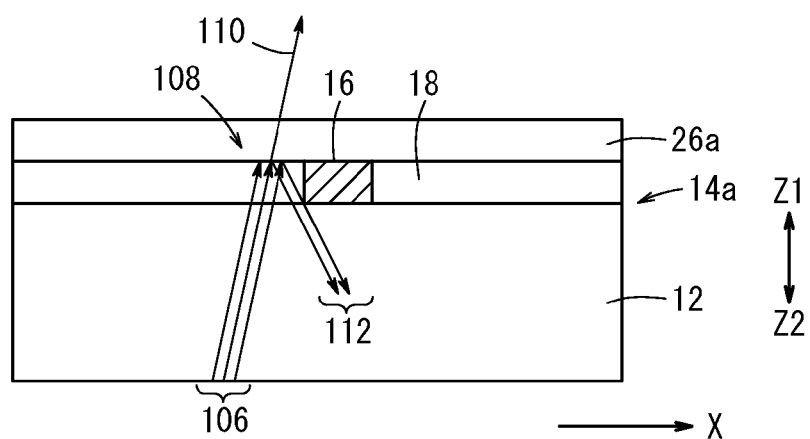
FIG. 13B is an outline schematic diagram showing paths of oblique light which are irradiated toward thin metal wires.

As shown in FIG. 13B, light (oblique light 106), which is incident at a slight angle with respect to the direction of the arrow Z1, is irradiated into the interior of the transparent substrate 12, and travels in a straight line to a second interface 108 between the first conductive portion 14a (openings 18) and the first protective layer 26a. In addition, concerning the oblique light 106, due to a refraction phenomenon caused by the second interface 108, a portion of the light (linear component 110) is transmitted through the first protective layer 26a, and the remainder of the light (reflected component 112) is reflected. At this time, since the relative index of refraction nr1 is far from the value 1, interfacial transmittance is decreased, and the amount of light of the linear component 110 (or the reflected component 112) decreases (or increases) relatively.

Figure 13C:
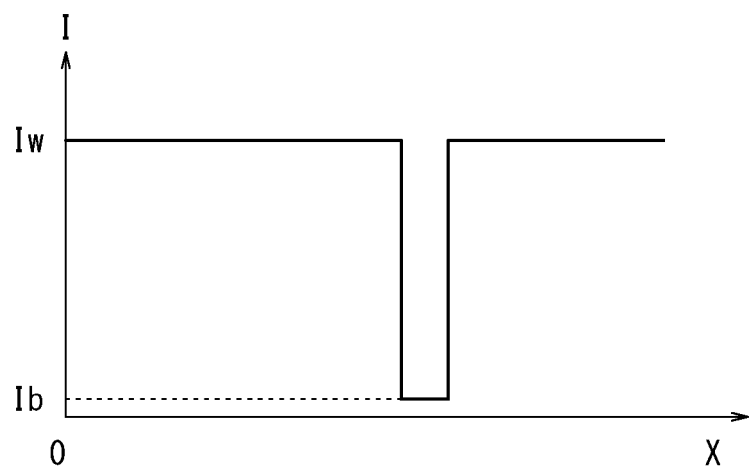
FIG. 13C is a graph showing an intensity distribution of transmitted light in FIG. 13B.

For example, as shown in FIG. 13C, a light intensity I=Iw at positions corresponding to the openings 18, and a light intensity I=Ib at positions corresponding to the thin metal wires 16, are transmitted respectively through the conductive laminate body 10 and detected. In this case, the optical density due to the thin metal wires 16 is represented by $\Delta D1 = -\log(Ib/Iw)$, on the basis of the detected light intensity at the openings 18.

Next, an optical phenomenon that occurs in the case that the difference in the index of refraction between the transparent substrate 12 and the first protective layer 26a is small, i.e., in the event that the relative index of refraction nr1 is near to the value 1, will be explained with reference to FIG. 14A and FIG. 14B.

In the case that the relative index of refraction nr1 is near to the value 1, as can be easily derived from optical considerations, the interfacial transmittance approaches 1 (the interfacial reflectance approaches 0). Accordingly, the light intensity of the linear component 114 (or the reflected component 116) is increased (or decreased) relatively compared to the case of FIG. 13B. Stated otherwise, the light intensity transmitted through the interior of the transparent substrate 12 without being subjected to scattering increases uniformly irrespective of the position of the thin metal wires 16 that are constituted from a non-translucent material. Below, for facilitating explanation, it will be assumed that the detected light intensity is increased by a value (positive value) $\epsilon$.

Figure 14A:
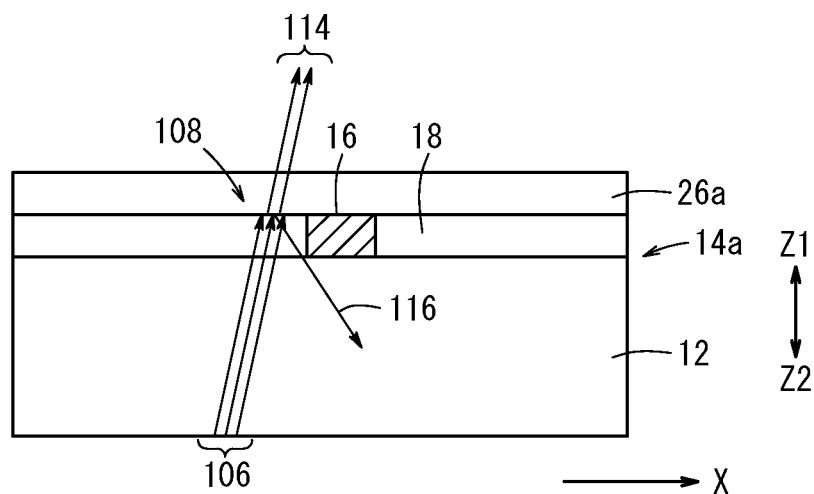
FIG. 14A is an outline schematic diagram showing paths of oblique light which are irradiated toward thin metal wires in a configuration according to the present invention.
Figure 14B:
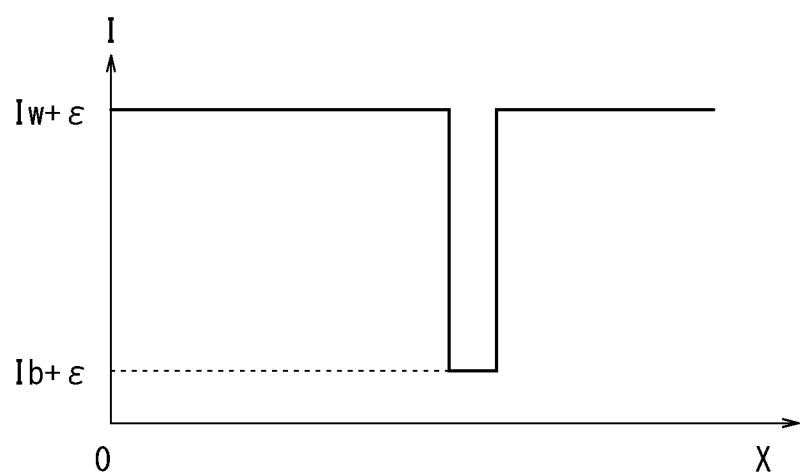
FIG. 14B is a graph showing an intensity distribution of transmitted light in FIG. 14A.

At this time, as shown in FIG. 14A and FIG. 14B, a light intensity I=Iw+$\epsilon$ at a position corresponding to the openings 18, and a light intensity I=Ib+$\epsilon$ at the position corresponding to the thin metal wires 16 are transmitted respectively and detected. The optical density due to the thin metal wires 16 is represented by $\Delta D2 = -\log\{(Ib+\epsilon)/(Iw+\epsilon)\}$, on the basis of the detected light intensity at the openings 18.

Since the inequality (Ib/Iw)<(Ib+$\epsilon$)/(Iw+$\epsilon$) is satisfied if Iw>Ib≥0 and $\epsilon$>0, the relationship $\Delta D1 > \Delta D2$ normally holds true. More specifically, by maintaining the relative index of refraction nr1 between the transparent substrate 12 and the first protective layer 26a close to the value 1, contrast in optical density due to the thin metal wires 16 can be reduced. As a result, in a case where the display device 40 is viewed in plan, it is difficult for the user to visually perceive the pattern of the thin metal wires 16.

The same advantages can be realized not only in relation to the transparent substrate 12 and the first protective layer 26a shown in FIG. 2, but also in relation to the transparent substrate 12 and the second protective layer 26b (see FIG. 2). The same also holds true in relation to the first transparent substrate 12a and the first protective layer 26a shown in FIG. 11, or in relation to the second transparent substrate 12b and the second protective layer 26b.

The relative indices of refraction nr1, nr2 preferably are in the range of 0.86-1.15, and more preferably, are in the range of 0.91-1.08. In particular, if at least one of the first protective layer 26a and the second protective layer 26b are made from the same material as the transparent substrate 12, the equation nr1=1 (nr2=1) is satisfied, which is even more preferable.

In the foregoing manner, at least one of the relative index of refraction nr1 of the transparent substrate 12 (or the first transparent substrate 12a) with respect to the first protective layer 26a, and the relative index of refraction nr2 of the transparent substrate 12 (or the second transparent substrate 12b) with respect to the second protective layer 26b is in the range of 0.86-1.15. Therefore, among the light (oblique light 106), which is inclined slightly with respect to a direction normal to the transparent substrate 12 (the direction of the arrow Z1), the light intensity (linear component 114) at at least one of the interface between the transparent substrate 12 and the first protective layer 26a, and the interface between the transparent substrate 12 and the second protective layer 26b is increased relatively. More specifically, the amount of light that passes through the interior of the transparent substrate 12 without scattering increases uniformly irrespective of the position of the thin metal wires 16 that are constituted from a non-translucent material. Consequently, contrast in optical density caused by the thin metal wires 16 can be decreased, thus making such contrast less visible to an observer (user). In particular, with a mesh pattern 20 in which the same mesh shapes 22 are arranged regularly, generation of moiré phenomena can be suppressed more effectively. Moreover, the mesh shapes 22 are not limited to being of the shapes (diamond shapes) shown in FIG. 1, and it goes without saying that various other shapes may be adopted as well.

[Method of Forming First Conductive Portion 14a and Second Conductive Portion 14b]

Next, in a method of forming the first conductive portion 14a and the second conductive portion 14b, for example, by exposing to light a photosensitive material including an emulsion layer containing a photosensitive silver halide salt on the transparent substrate 12, and carrying out development processing thereon, metallic silver portions and light permeable portions may be formed respectively in exposed and non-exposed areas, to thereby form the first conductive portion 14a and the second conductive portion 14b. Moreover, by further implementing at least one of a physical development treatment and a plating treatment on the metallic silver portions, a conductive metal may be deposited on the metallic silver portions. With respect to the conductive laminate body 10 shown in FIG. 2, etc., the following manufacturing method indicated below preferably is adopted. More specifically, a one-shot exposure is carried out with respect to photosensitive silver halide emulsion layers formed on both surfaces of the transparent substrate 12, the first conductive portion 14a is formed on one main surface of the transparent substrate 12, and the second conductive portion 14b is formed on the other main surface of the transparent substrate 12.

A detailed example of the production method will be described below with reference to FIGS. 15 through 17.

Figure 15:
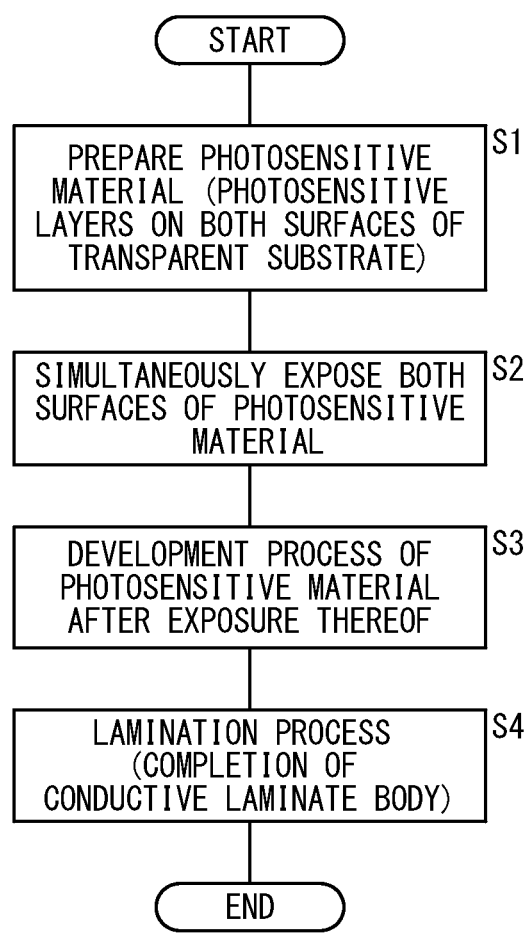
FIG. 15 is a flowchart providing a description of a manufacturing method for the conductive laminate body according to the present embodiment.
Figure 16A:
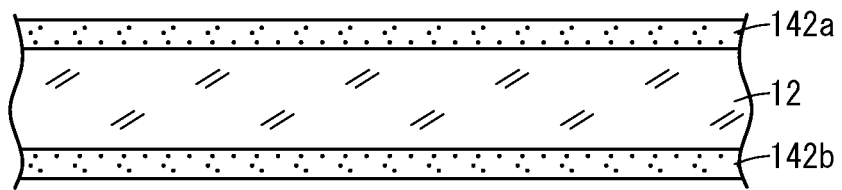
FIG. 16A is a cross sectional view showing a situation in which a produced photosensitive material is partially omitted.

First, in step S1 of FIG. 15, an elongate photosensitive material 140 is prepared. As shown in FIG. 16A, the photosensitive material 140 has the transparent substrate 12, a photosensitive silver halide emulsion layer (hereinafter referred to as a first photosensitive layer 142a) formed on one main surface of the transparent substrate 12, and a photosensitive silver halide emulsion layer (hereinafter referred to as a second photosensitive layer 142b) formed on the other main surface of the transparent substrate 12.

Figure 16B:
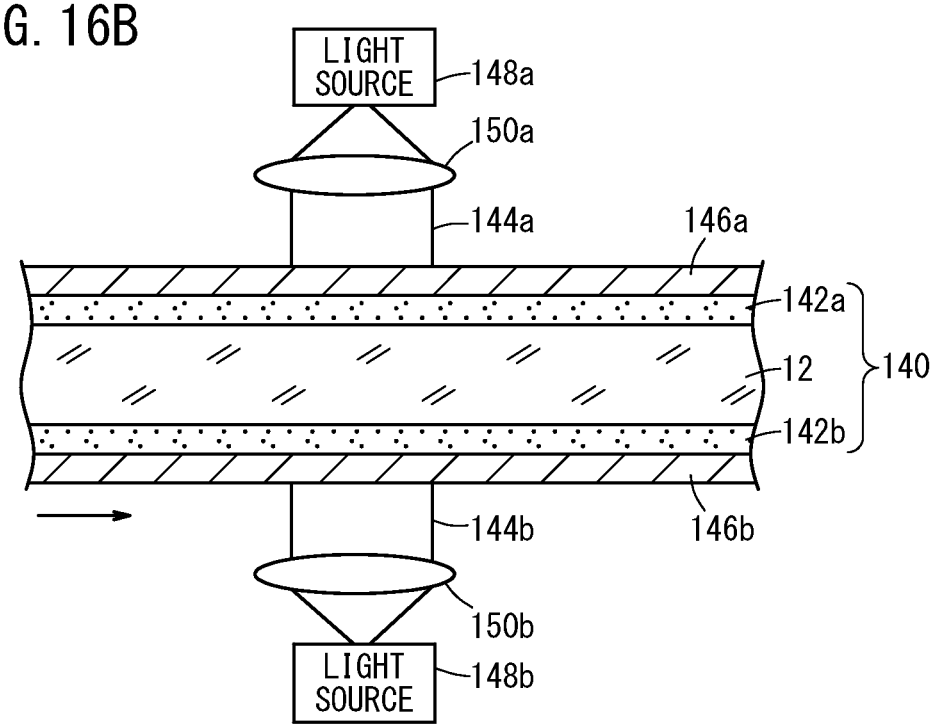
FIG. 16B is an outline schematic diagram showing simultaneous exposure of both surfaces with respect to the photosensitive material.

In step S2 of FIG. 15, the photosensitive material 140 is exposed. In this step, an exposure treatment (two-sided one-shot exposure) is carried out, which includes a first exposure treatment for irradiating the first photosensitive layer 142a on the transparent substrate 12 with light in a first exposure pattern, and a second exposure treatment for irradiating the second photosensitive layer 142b on the transparent substrate 12 with light in a second exposure pattern. In the example of FIG. 16B, the first photosensitive layer 142a is irradiated through a first photomask 146a with first light 144a (parallel light), and the second photosensitive layer 142b is irradiated through a second photomask 146b with second light 144b (parallel light), while the elongate photosensitive material 140 is conveyed in one direction. The first light 144a is light from a first light source 148a that is converted into parallel light by an intervening first collimator lens 150a, and the second light 144b is light from a second light source 148b that is converted into parallel light by an intervening second collimator lens 150b.

Although two light sources (the first light source 148a and the second light source 148b) are used in the example of FIG. 16B, a single light source may be used. In this case, light from one light source may be divided by an optical system into the first light 144a and the second light 144b, which are used to irradiate the first photosensitive layer 142*a* and the second photosensitive layer 142*b*.

In addition, in step S3 of FIG. 15, the exposed photosensitive material 140 is subjected to a development process. The exposure time and the development time for the first photosensitive layer 142*a* and the second photosensitive layer 142*b* change depending on the type of the first light source 148*a*, the second light source 148*b*, and the developer, etc., and preferred numerical ranges therefore cannot be determined categorically. However, the exposure time and the development time are adjusted to achieve a development ratio of 100%.

Figure 17:
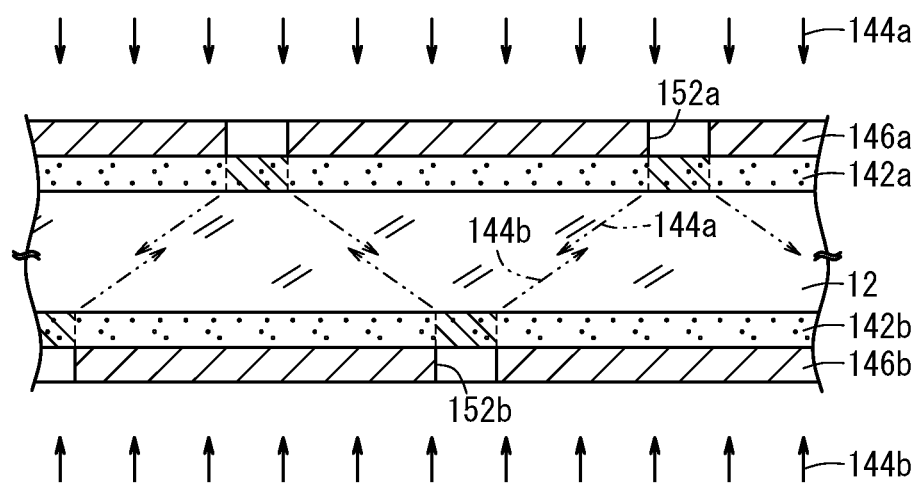
FIG. 17 is an outline schematic diagram showing a condition in which a first exposure process and a second exposure process are implemented.

In addition, as shown in FIG. 17, in the first exposure treatment in a production method of according to the second embodiment, for example, the first photomask 146*a* is placed in close contact with the first photosensitive layer 142*a*, the first light source 148*a* is arranged in facing relation to the first photomask 146*a*, and the first light 144*a* is emitted from the first light source 148*a* toward the first photomask 146*a*, whereby the first photosensitive layer 142*a* is exposed. The first photomask 146*a* is constituted from a glass substrate composed of transparent soda glass, and a mask pattern (first exposure pattern 152*a*) formed on the glass substrate. Consequently, in the first exposure treatment, areas in the first photosensitive layer 142*a*, corresponding to the first exposure pattern 152*a* in the first photomask 146*a*, are exposed. A space of approximately 2-10 μm may be formed between the first photosensitive layer 142*a* and the first photomask 146*a*.

Similarly, in the second exposure treatment, the second photomask 146*b* is placed in close contact with the second photosensitive layer 142*b*, the second light source 148*b* is arranged in facing relation to the second photomask 146*b*, and the second light 144*b* is emitted from the second light source 148*b* toward the second photomask 146*b*, whereby the second photosensitive layer 142*b* is exposed. The second photomask 146*b*, similar to the first photomask 146*a*, is constituted from a glass substrate composed of transparent soda glass, and a mask pattern (second exposure pattern 152*b*) formed on the glass substrate. Consequently, in the second exposure treatment, areas in the second photosensitive layer 142*b*, corresponding to the second exposure pattern 152*b* in the second photomask 146*b*, are exposed. A space of approximately 2-10 μm may be formed between the second photosensitive layer 142*b* and the second photomask 146*b*.

In the first and second exposure treatments, the timing of emission of first light 144*a* from the first light source 148*a*, and the timing of emission of second light 144*b* from the second light source 148*b* may be carried out simultaneously or independently. In the case that the emissions are carried out simultaneously, the first photosensitive layer 142*a* and the second photosensitive layer 142*b* can be exposed simultaneously in one exposure process, thus enabling the treatment time to be reduced.

Then, in step S4 of FIG. 15, a lamination process is carried out on the photosensitive material 140 following development thereof, whereby the conductive laminate body 10 is completed. More specifically, the first protective layer 26*a* is formed on the side of the first photosensitive layer 142*a*, and the second protective layer 26*b* is formed on the side of the second photosensitive layer 142*b*. As a result, the first sensor part 60*a* and the second sensor part 60*b*, etc., are protected.

In the foregoing manner, using the above two-sided one-shot exposure production method, the electrodes of the touch panel 44 can be formed easily, and the touch panel 44 can be made thinner (lower in profile).

In the above example, the first conductive portion 14*a* and the second conductive portion 14*b* are formed using a photosensitive silver halide emulsion layer. However, other production methods may be used, including the following methods.

For example, the first conductive portion 14*a* and the second conductive portion 14*b* may be formed by exposing a photoresist film on a copper foil formed on the transparent substrate 12, followed by performing a development treatment to form a resist pattern, and then etching parts of the copper foil through the resist pattern. Alternatively, the first conductive portion 14*a* and the second conductive portion 14*b* may be formed by printing a paste, which contains metal micro-particles on the transparent substrate 12, and then subjecting the printed paste to metal plating. Alternatively, the first conductive portion 14*a* and the second conductive portion 14*b* may be formed on the transparent substrate 12 by printing using a screen printing plate or a gravure printing plate. Alternatively, the first conductive portion 14*a* and the second conductive portion 14*b* may be formed by carrying out inkjet printing on the transparent substrate 12.

[Manufacturing Method Using Silver Halide Photosensitive Material]

Next, in the conductive laminate body 10 according to the present embodiment, a method will be discussed focusing on use of a silver halide photosensitive material as a particularly preferred form thereof.

The method of manufacturing the conductive laminate body 10 according to the present embodiment includes the following three processes, depending on the photosensitive materials and development treatments.

(1) A process comprising subjecting a photosensitive black-and-white silver halide material free of physical development nuclei to a chemical or thermal development, to form the metallic silver portions on the photosensitive material.

(2) A process comprising subjecting a photosensitive black-and-white silver halide material having a silver halide emulsion layer containing physical development nuclei to a solution physical development process, to thereby form the metallic silver portions on the photosensitive material.

(3) A process comprising subjecting a stack of a photosensitive black-and-white silver halide material free of physical development nuclei and an image-receiving sheet having a non-photosensitive layer containing physical development nuclei to a diffusion transfer development, to form the metallic silver portions on the non-photosensitive image-receiving sheet.

In process (1), an integral black-and-white development procedure is used to form a translucent conductive film on the photosensitive material. The resulting silver is chemically or thermally developed silver containing a high-specific surface area filament, and thereby exhibits a high activity in the following plating or physical development treatment.

In process (2), silver halide particles are melted around the physical development nuclei and deposited on the nuclei in exposed areas, to form a translucent conductive film, such as a light-transmitting conductive film, on the photosensitive material. Also in this process, an integral black-and-white development procedure is used. Although high activity can be achieved since the silver halide is deposited on the physical development nuclei during development, the developed silver has a spherical shape with a small specific surface.

In process (3), silver halide particles are melted in unexposed areas, and diffused and deposited on the development nuclei of an image-receiving sheet, to thereby form a translucent conductive film, such as a light-transmitting conductive film, on the sheet. In this process, a so-called separation-type procedure is used, and the image-receiving sheet is peeled off from the photosensitive material.

A negative or reversal development treatment can be used in any of the foregoing processes. In the diffusion transfer development, the negative development treatment can be carried out using an auto-positive photosensitive material.

The chemical development, thermal development, solution physical development, and diffusion transfer development have the meanings generally known in the art, and are explained in common photographic chemistry texts such as Shinichi Kikuchi, "Shashin Kagaku (Photographic Chemistry)", Kyoritsu Shuppan Co., Ltd., 1955, and C. E. K. Mees, "The Theory of Photographic Processes, 4th ed.", McMillan, 1977. A liquid treatment is generally used in the present invention, and also a thermal development treatment can be utilized. For example, the techniques described in Japanese Laid-Open Patent Publication Nos. 2004-184693, 2004-334077, and 2005-010752, and Japanese Patent Application Nos. 2004-244080 and 2004-085655 can be used in the present invention.

An explanation shall now be given in relation to the structure of each layer of the conductive laminate body 10 according to the present embodiment.

[Transparent Substrate 12]

Plastic films, plastic plates, glass plates or the like can be given as examples of materials to be used as the transparent substrate 12.

As materials for the aforementioned plastic film and plastic plate, there can be used, for example, polyesters such as polyethylene terephthalate (PET), polyethylene naphthalate (PEN), etc., and Polymethyl Methacrylate (PMMA), Polypropylene (PP), Polystyrene (PS), Triacetyl Cellulose (TAC), etc.

As materials for the transparent substrate 12, preferably, plastic films or plastic plates having a melting point less than or equal to about 290° C. are used. In particular, PET is preferred from the standpoints of workability and optical transparency.

[Silver Halide Emulsion Layer]

The silver halide emulsion layer that forms the thin metal wires 16 of the first stacked portion 28a and the second stacked portion 28b includes additives such as solvents and dyes, etc., in addition to silver salt and a binder.

<1. Silver Salt>

The silver salt used in the present embodiment may include an inorganic silver salt such as a silver halide and an organic silver salt such as silver acetate or the like. In the present embodiment, preferably, silver halide is used, which has excellent light sensitive properties.

The coated silver amount (silver salt coating amount) of the silver halide emulsion layer, in terms of the silver therein, preferably is 1-30 g/m$^2$, more preferably is 1-25 g/m$^2$, and still more preferably, is 5-20 g/m$^2$. By keeping the silver coating amount within the above-described ranges, desirable surface resistivity can be obtained in the case of the conductive laminate body 10.

<2. Binder>

As examples of binders that are used in the present embodiment, there may be used, for example, gelatins, polyvinyl alcohols (PVA), polyvinyl pyrolidones (PVP), polysaccharides such as starches, celluloses and derivatives thereof, polyethylene oxides, polyvinylamines, chitosans, polylysines, polyacrylic acids, polyalginic acids, polyhyaluronic acids, and carboxycelluloses, etc. Such binders exhibit neutral, anionic, or cationic properties depending on the ionic properties of the functional group.

The contained weight of the binder that is included in the silver salt emulsion layer of the present embodiment is not particularly limited, but can be determined suitably from within a range that exhibits properties of good dispersibility and adhesion. The contained weight of the binder in the silver salt emulsion layer preferably is 1/4 or greater, and more preferably, is 1/2 or greater in terms of the silver/binder volume ratio. The silver to binder (silver/binder) volume ratio is preferably 100/1 or less, and more preferably, is 50/1 or less. Further, the silver to binder volume ratio is preferably 1/1 to 4/1, and most preferably, is 1/1 to 3/1. By maintaining the silver to binder volume ratio of the silver salt emulsion layer within such ranges, even in the event that the amount of the silver coating is adjusted, variance in resistance is suppressed, and a conductive laminate body 10 having uniform surface resistivity can be obtained. Incidentally, the silver to binder volume ratio can be determined by converting the silver halide amount/binder amount of the raw materials (weight ratio) into a silver amount/binder amount (weight ratio), and furthermore, by converting the silver amount/binder amount (weight ratio) into a silver amount/binder amount (volume ratio).

<3. Solvents>

Solvents used in forming the silver salt emulsion layer are not particularly limited. The following solvents can be cited as examples: water, organic solvents (e.g., alcohols such as methanol, ketones such as acetone, amides such as formamide, sulfoxides such as dimethyl sulfoxide, esters such as ethyl acetate, and ethers), ionic liquids, and mixtures of such solvents.

<4. Other Additive Agents>

In relation to various additive agents used in the present embodiment, the additive agents are not limited, and preferably, known types of such additive agents can be used.

[First Protective Layer 26a, Second Protective Layer 26b]

As the first protective layer 26a and the second protective layer 26b, similar to the transparent substrate 12, plastic films, plastic plates, glass plates or the like can be given as examples of materials to be used therefor. For example, PET, PEN, PMMA, PP, PS, TAC, etc., can be used.

The thickness of the first protective layer 26a and the second protective layer 26b is not particularly limited, and can easily be selected responsive to aims of the invention. For example, preferably, the thickness is 5-100 μm, more preferably, is 8-50 μm, and still more preferably, is 10-30 μm.

Next, respective steps of a method of manufacturing the conductive laminate body 10 will be described.

[Exposure]

In the present embodiment, although a case has been described in which the first conductive portion 14a and the second conductive portion 14b are implemented by means of a printing technique, apart from using a printing technique, the first conductive portion 14a and the second conductive portion 14b may be formed by exposure, development, etc. More specifically, exposure is carried out on the photosensitive material including the silver salt-containing layer, or on the photosensitive material on which the photolithographic photopolymer is coated, which is disposed on the transparent substrate 12. Exposure can be carried out by use of electromagnetic waves. For example, light such as visible light or ultraviolet light, or radiation such as X-rays or the like may be used to generate electromagnetic waves. Exposure may also be carried out using a light source having a wavelength distribution or a specific wavelength.

[Development Treatment]

In the present embodiment, after exposure of the emulsion layer, the emulsion layer is further subjected to a development treatment. The development treatment can be performed using common development treatment technologies for silver halide photographic films, photographic papers, printing plate films, emulsion masks for photomasking, and the like.

The development process according to the present invention can include a fixing process, which is carried out with the aim of stabilizing by removing unexposed portions of the silver salt. The fixing process in the present invention can utilize a fixing technique that makes use of a silver halide photographic film, photographic paper, a printing plate film, an emulsion mask for a photomask, or the like.

Preferably, at least one of a water washing process and a stabilization treatment is carried out on the photosensitive material on which the development and fixing processes have been implemented.

The amount by mass of the metallic silver portion included in the exposed portions after the development process preferably is of a content ratio of 50 percent by mass or greater, and more preferably is 80 percent by mass or greater, with respect to the amount by mass of the silver contained in the exposed portion prior to being exposed. If the amount by mass of the silver contained in the exposed portion is 50 percent by mass or greater with respect to the amount by mass of the silver contained in the exposed portion prior to being exposed, then a high degree of conductivity can be obtained.

The conductive laminate body 10 is obtained by the above steps. The conductive laminate body 10 may further be subjected to a calendaring treatment after the development treatment. By means of a calendaring treatment, adjustment to a desired surface resistivity can be achieved. The surface resistivity of the resultant conductive laminate body 10 preferably is within a range of 0.1-300 ohm/sq.

The surface resistivity differs depending on how the conductive laminate body 10 is used. For example, in the case of being used as a touch panel, the surface resistivity preferably is 1-70 ohm/sq., and more preferably, is 5-50 ohm/sq., and still more preferably, is 5-30 ohm/sq. Further, in the case of being used as an electromagnetic wave shield, the surface resistivity preferably is less than or equal to 10 ohm/sq., and more preferably, is 0.1-3 ohm/sq.

[Physical Development and Plating Treatments]

In the present embodiment, in order to improve the conductivity of the metallic silver portion formed by the above exposure and development treatments, conductive metal particles may be deposited on the metallic silver portion by at least one of a physical development treatment and a plating treatment. In the present invention, the conductive metal particles may be deposited on the metallic silver portion by only one of the physical development and plating treatments, or by a combination of such treatments. The metallic silver portion, which is subjected to at least one of a physical development treatment and a plating treatment in this manner, may also be referred to as a "conductive metal portion", as well as the metallic silver portion itself.

In the present embodiment, "physical development" refers to a process in which metal ions such as silver ions are reduced by a reducing agent, whereby metal particles are deposited on a metal or metal compound core. Such physical development has been used in the fields of instant B&W film, instant slide film, printing plate production, etc., and similar technologies can be used in the present invention. Physical development may be carried out at the same time as the above development treatment following exposure, or may be carried out separately after completion of the development treatment.

In the present embodiment, the plating treatment may contain non-electrolytic plating (such as chemical reduction plating or displacement plating), electrolytic plating, or a combination of both non-electrolytic plating and electrolytic plating. Known non-electrolytic plating technologies, for example, technologies used in printed circuit boards, etc., may be used in the present embodiment. Preferably, electroless copper plating is used in the case of such non-electrolytic plating.

With the manufacturing method for the conductive laminate body 10 according to the present invention, the plating step, etc., are not indispensable. In the present manufacturing method, a desired surface resistivity can be obtained by adjusting the coated silver amount of the silver salt emulsion layer, and the silver/binder volumetric ratio.

[Oxidation Treatment]

In the present embodiment, the metallic silver portion following the development treatment and the conductive metal portion, which is formed by at least one of the physical development treatment and the plating treatment, preferably are subjected to an oxidation treatment. For example, by the oxidation treatment, a small amount of metal deposited on the light-transmitting portion can be removed, so that the transmittance of the light-transmitting portion can be increased to roughly 100%.

[Conductive Metal Portions]

The wire width (wire width of the thin metal wires 16) of the conductive metal portions of the present embodiment can be selected from values less than or equal to 30 µm, the lower limit value of which preferably is greater than or equal to 0.1 µm, greater than or equal to 1 µm, greater than or equal to 3 µm, greater than or equal to 4 µm, or greater than or equal to 5 µm, and the upper limit value of which preferably is less than or equal to 30 µm, less than or equal to 15 µm, less than or equal to 10 µm, less than or equal to 9 µm, or less than or equal to 8 µm. In the case that the wire width is less than the aforementioned lower limit values, conductivity is insufficient, and thus if used in the touch panel 44, detection sensitivity is insufficient. On the other hand, if the wire width exceeds the upper limit values, moiré phenomena caused by the conductive metal portions become noticeable, and if used in the touch panel 44, visibility is worsened. In a case where the wire width falls within the above range, moiré phenomena of the conductive metal portions is suppressed, and thus visibility is significantly improved.

The length of one side of the small lattices 76a, 76b preferably is greater than or equal to 100 µm and less than or equal to 400 µm, more preferably, is greater than or equal to 150 µm and less than or equal to 300 µm, and most preferably, is greater than or equal to 210 µm and less than or equal to 250 µm. Further, with the aim of providing a ground connection or the like, the conductive metal portions include portions the wire width of which is wider than 200 µm.

In the present embodiment, the conductive metal portions, from the viewpoint of enabling visible-light transmittance, preferably have an aperture (opening) ratio of 85% or greater, more preferably, of 90% or greater, and most preferably, of 95% or greater. The aperture ratio is a percentage occupied in total by the translucent portions exclusive of the thin metal wires 16. For example, in the case of a diamond-shaped aperture formed by thin metal wires having a wire width of 6 μm and a side length of 240 μm, the aperture ratio is 95%.

[Light-Transmitting Portions]

The term "light-transmitting portions" in the present embodiment implies portions that are transmissive to light within the conductive laminate body 10 other than the conductive metal portions thereof. As stated previously, the transmittance of the light-transmitting portions, which is herein a minimum value of transmittance within a wavelength range of 380-780 nm eliminating any contribution of light absorption and reflection of the transparent substrate 12, is greater than or equal to 90%, more preferably, is greater than or equal to 95%, more preferably, is greater than or equal to 97%, still more preferably, is greater than or equal to 98%, and most preferably, is greater than or equal to 99%. Concerning the exposure method, a method via a glass mask, or a pattern exposure method by way of laser rendering is preferred.

[Conductive Laminate Body 10]

The thickness of the transparent substrate 12 in the conductive laminate body 10 according to the present embodiment preferably is 5-350 μm, and more preferably, is 30-150 μm. If the thickness remains within the range of 5-350 μm, a desired transmittance of visible light can be obtained, and handling thereof is facilitated.

The thickness of the metallic silver portion provided on the transparent substrate 12 can be suitably determined corresponding to the coating thickness of a silver salt containing layer coated on the transparent substrate 12. Although the thickness of the metallic silver portion can be selected from within a range of 0.001 mm-0.2 mm, the thickness preferably is less than or equal to 30 μm, more preferably is less than or equal to 20 μm, still more preferably is 0.01-9 μm, and most preferably, is 0.05-5 μm. Further, the metallic silver portion preferably is formed as a pattern. The metallic silver portion may be formed in a single layer, or with a multilayer configuration of two or more layers. In the case that the metallic silver portion is in the form of a pattern, and has a multilayer configuration of two or more layers, different color sensitivities can be imparted, thus enabling sensitivity to light in different wavelengths. In this manner, if exposure is carried out while changing the exposure wavelength, different patterns can be formed in the respective layers.

For use in a touch panel 44, the conductive metal portions preferably have a small thickness because the viewing angle of the display panel becomes widened as the conductive metal portions are made thinner, and a thin-filmed structure also is required from the standpoint of enhancing visibility. From this viewpoint as well, the thickness of the layer made up from the conductive metal that is supported on the conductive metal portions preferably is less than 9 μm, more preferably, is greater than or equal to 0.1 μm and less than 5 μm, and still more preferably, is greater than or equal to 0.1 μm and less than 3 μm.

In the present embodiment, since a metallic silver portion of a desired thickness can be formed by controlling the coating thickness of the aforementioned silver salt containing layer, and the thickness of a layer made up from conductive metal particles can be controlled freely by at least one of a plating process and a physical development process, even a conductive laminate body 10 having a thickness of less than 5 μm, and preferably, a thickness of less than 3 μm, can be formed easily.

[Hardening Treatment Following Development Treatment]

It is preferred, after the silver salt emulsion layer has been developed, for the resultant product to be immersed in a hardener and subjected to a hardening treatment. Examples of suitable hardeners, for example, can include dialdehyde type hardeners such as glutaraldehyde, adipaldehyde, and 2,3-dihydroxy-1,4-dioxane, and boric acid type hardeners, as described in Japanese Laid-Open Patent Publication No. 02-141279.

In the conductive laminate body 10 according to the present embodiment, a layer that functions as an antireflection layer, a hard coat layer, or the like, may also be provided.

[Calendaring Treatment]

A calendaring treatment may be carried out to effect smoothing on the developed metallic silver portion. As a result, conductivity of the metallic silver portion can be markedly increased. The calendaring treatment can be performed using a calendar roll, wherein such a calendar roll typically is made up from a pair of rolls.

As rolls that are used in the calendaring process, plastic rolls of epoxy, polyimide, polyamide, polyimide amide, etc., or metallic rolls are used. In particular, in the case of using emulsion layers on both surfaces, preferably, processing is carried out by a pair of metallic rolls. In the case of having an emulsion layer on one side only, from the standpoint of preventing wrinkles, a metallic roll and a plastic roll can be used together in combination. The upper limit value of linear pressure applied by the rolls is 1960 N/cm (200 kgf/cm, or 699.4 kgf/cm$^2$ if converted to surface pressure) or greater, and more preferably, is 2940 N/cm (300 kgf/cm, or 935.8 kgf/cm$^2$ if converted to surface pressure) or greater. The upper limit value of linear pressure is 6880 N/cm (700 kgf/cm) or less.

The applicable temperature at which the smoothing process represented by calendar rollers is carried out preferably lies within a range of 10° C. (without temperature adjustment) to 100° C., and more preferably, lies within a range of 10° C. (without temperature adjustment) to 50° C., although the applicable temperature range differs depending on the type of binder, or the image line density and shape of the metallic mesh pattern or the metallic wiring pattern.

[Laminating Process]

For protecting the first sensor part 60a and the second sensor part 60b, etc., a protective layer may be formed on the silver halide emulsion layer. Adhesiveness can be adjusted freely by disposing the first adhesive layer 24a (or the second adhesive layer 24b) between the protective layer and the silver halide emulsion layer.

Wet laminating adhesives, dry laminating adhesives, or hot melt adhesives, etc., may be used as suitable materials for the first adhesive layer 24a and the second adhesive layer 24b. In particular, the dry laminating adhesives are particularly preferred in light of their fast bonding speed and a variety of types of materials that can be bonded thereby. More specifically, as dry laminating adhesives, amino resin adhesives, phenol resin adhesives, chloroprene rubber adhesives, nitrile rubber adhesives, epoxy adhesives, urethane adhesives, and reactive acrylic adhesives, etc., can be used. Among such adhesives, OCA (Optical Clear Adhesive, Registered Trademark) manufactured by Sumitomo 3M, which is an acrylic-based low acid value adhesive, is preferred.

Concerning the drying conditions, a temperature environment of 30°-150° C. for 1-30 minutes is preferred. A drying temperature of 50°-120° C. is particularly preferred.

Further, instead of the aforementioned adhesive layer, interlayer adhesion can be regulated by surface treatment of at least one of the transparent substrate 12 and the protective layer. For enhancing adhesive strength with the silver halide emulsion layer, for example, a corona discharge treatment, a flame treatment, an ultraviolet irradiation treatment, a high frequency irradiation treatment, a glow discharge irradiation treatment, an active plasma irradiation treatment, and a laser beam irradiation treatment, etc., may be implemented.

In the present invention, the technologies of the following Japanese Laid-Open Patent Publications and PCT International Publication Numbers shown in Table 1 and Table 2 can appropriately be used in combination. In the following Tables 1 and 2, conventional notations such as "Japanese Laid-Open Patent Publication No.", "Publication No.", "Pamphlet No. WO", etc., have been omitted.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153 | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLES

Examples of the present invention will be described more specifically below. Materials, amounts, ratios, treatment contents, treatment procedures, and the like, used in the examples may be appropriately changed without departing from the essential scope of the present invention. Therefore, the following specific examples should be considered in all respects as illustrative and not restrictive.

In the examples, in relation to conductive laminate bodies 10 according to Inventive Examples 1 to 6, and Comparative Examples 1 and 2, moiré phenomena and the rate of change in brightness of the display device 40 in combination with the conductive laminate bodies 10 were evaluated.

Inventive Examples 1 to 6, Comparative Examples 1 and 2

Photosensitive Silver Halide Material

An emulsion containing an aqueous medium, gelatin and silver iodobromochloride particles was prepared. The amount of gelatin was 10.0 g per 150 g of Ag in the aqueous medium. The silver iodobromochloride particles therein had an I content of 0.2 mol %, a Br content of 40 mol %, and an average spherical equivalent diameter of 0.1 μm.

$K_3Rh_2Br_9$ and $K_2IrCl_6$ were added to the emulsion at a concentration of $10^{-7}$ mol/mol-Ag in order to dope the silver bromide particles with Rh and Ir ions. $Na_2PdCl_4$ was further added to the emulsion, and the resultant emulsion was subjected to gold-sulfur sensitization using chlorauric acid and sodium thiosulfate. Thereafter, the emulsion and a gelatin hardening agent were applied to each of a transparent substrate (composed of polyethylene terephthalate (PET) having an index of refraction n0=1.64) such that the amount of applied silver was 10 g/m². The Ag/gelatin volume ratio was 2/1.

The PET support body had a width of 300 mm, and the emulsion was applied thereto at a width of 250 mm and a length of 20 m. Both end portions having a width of 30 mm were cut off from the PET support body in order to obtain a roll-shaped photosensitive silver halide material having a central coating width of 240 mm.

(Generation of Exposure Pattern)

A first exposure pattern corresponding to the wiring arrangement shown in FIGS. 6A and 7, and a second exposure pattern corresponding to the wiring arrangement shown in FIGS. 6B and 8 were created respectively. The method by which the respective pattern shapes were determined is as follows.

Under a condition in which the range for the pitch Ps (a side length of the small lattices 94) shown in FIG. 1 was set at 200-400 μm, and the range for the angle formed between the imaginary line 23 (first direction) and the direction of the arrow q (one side of the small lattices 94) was 30°-45°, respective values thereof were extracted independently and randomly, and exposure patterns of 20 different types were determined in which the above values were combined at random. In all of the 20 types of exposure patterns, the wire width of the thin metal wires 16 (small lattices 94) was 6 μm, and the length of one side of the first large lattices 72a and the second large lattices 72b (see FIG. 6A and FIG. 6B) was 5 mm.

(Exposure)

Exposure was carried out respectively with respect to both surfaces of an A4 sized (210 mm×297 mm) transparent substrate 12. Exposure was performed through photomasks of the above-described first exposure pattern (corresponding to the first conductive portion 14a) and second exposure pattern (corresponding to the second conductive portion 14b), using a high-pressure mercury lamp as a parallel light source.

(Developing Technique)

The following chemical compounds were included in 1 liter of the developing solution.

| | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | controlled at 10.3 |

The following chemical compounds were included in 1 liter of the fixing solution.

| | |
|---|---|
| Ammonium thiosulfate solution (75%) | 300 ml |
| Ammonium sulfite monohydrate | 25 g |
| 1,3-Diaminopropanetetraacetic acid | 8 g |
| Acetic acid | 5 g |
| Aqueous ammonia (27%) | 1 g |
| pH | controlled at 6.2 |

Using the treatment agents as listed above, a development treatment was conducted on the photosensitive material following exposure thereof using an automatic development machine FG-710PTS (manufactured by FUJIFILM Corporation) under the following development conditions; development: 30 seconds at 35° C., fixation: 23 seconds at 34° C., water washing: 20 seconds under running water (5 L/min).
(Lamination Process)

The first protective layer 26a and the second protective layer 26b, which are made up from the same material, were attached, respectively, on both surfaces of the photosensitive material following development thereof. As described later, for each of the samples of the conductive laminate body 10, protective films were used having different indices of refraction n1, respectively. Further, a commercially available adhesive tape (NSS50-1310, thickness 50 μm, manufactured by New Tac Kasei Co., Ltd.) was used as the first adhesive layer 24a and the second protective layer 26b (see FIG. 2). In addition, after attachment of the first protective layer 26a and the second protective layer 26b, in order to prevent the occurrence of air bubbles, an autoclave treatment was carried out for 20 minutes at 0.5 atm. in a 40° C. environment.

For convenience of evaluation, the first protective layer 26a with a portion of the sheet thereof cut out was used. More specifically, a setup was provided in which a difference was observable one time between a case (index of refraction n1) in which the first protective layer 26a was formed, and a case (an air layer having an index of refraction of 1.00) in which the first protective layer 26a was not formed. In the following descriptions, a displayed location corresponding to the cutout portion of the first protective layer 26a is referred to an A region, while the remaining displayed location is referred to as a B region.

Inventive Example 1

A conductive laminate body 10 according to the first inventive example was manufactured in 20 types using polychlorotrifluoroethylene (PCTFE) with an index of refraction n1=1.42 as the first protective layer 26a. In this case, the relative index of refraction nr1 was nr1=(1.42/1.64)=0.86.

Inventive Example 2

A conductive laminate body 10 according to the second inventive example was manufactured in 20 types using polymethyl methacrylate (PMMA) with an index of refraction n1=1.50 as the first protective layer 26a. In this case, the relative index of refraction nr1 was nr1=(1.50/1.64)=0.91.

Inventive Example 3

A conductive laminate body 10 according to the third inventive example was manufactured in 20 types using polystyrene (PS) with an index of refraction n1=1.60 as the first protective layer 26a. In this case, the relative index of refraction nr1 was nr1=(1.60/1.64)=0.97.

Inventive Example 4

A conductive laminate body 10 according to the fourth inventive example was manufactured in 20 types using polythiourethane (PTU) with an index of refraction n1=1.70 as the first protective layer 26a. In this case, the relative index of refraction nr1 was nr1=(1.70/1.64)=1.03.

Inventive Example 5

A conductive laminate body 10 according to the fifth inventive example was manufactured in 20 types using glass with a high index of refraction n1=1.78 as the first protective layer 26a. In this case, the relative index of refraction nr1 was nr1=(1.78/1.64)=1.08.

Inventive Example 6

A conductive laminate body 10 according to the sixth inventive example was manufactured in 20 types using glass with an ultrahigh index of refraction n1=1.90 as the first protective layer 26a. In this case, the relative index of refraction nr1 was nr1=(1.90/1.64)=1.16.

Comparative Example 1

A conductive laminate body according to a first comparative example was manufactured in 20 types using tetrafluoroethylene (FEP) with an index of refraction n1=1.34 as a first protective layer. In this case, the relative index of refraction nr1 was nr1=(1.34/1.64)=0.81.

Comparative Example 2

A conductive laminate body according to a second comparative example was manufactured in 20 types using glass with an ultrahigh index of refraction n1=1.98 as a first protective layer. In this case, the relative index of refraction nr1 was nr1=(1.98/1.64)=1.20.
[Evaluation]

The samples according to Inventive Examples 1 to 6 and Comparative Examples 1 and 2 were bonded respectively on the display screen of the display unit 30. As the display unit 30, a commercially available color liquid crystal display (screen size: 11.6 type, 1366×768 dots, vertical and horizontal pixel pitches: both 192 μm) was used.
(Moiré Phenomena)

Under a condition in which the display unit 30 was controlled to display a white color (maximum brightness), three researchers carried out sensory evaluations, respectively, of moiré phenomena. The observation distance from the display screen was set at 300 mm, and the interior illumination was set at 300 lx, respectively.

In the present sensory evaluation, comparative observations were performed with respect to visibility results of the A region (a display area where the first protective layer 26a is not formed). More specifically, with respect to the A region, if the occurrence of moiré phenomena in the B region was significantly improved, 5 points were given; if improved, 4 points were given; if unchanged, 3 points were given; if made worse, 2 points were given; and if made significantly worse, 1 point was given, respectively. In addition, the scores given by the respective researchers (3 persons) for each of the sample types (20 types) were averaged to provide an evaluation value of the moiré phenomena. More specifically, the evaluation values correspond to average values of points over a combination evaluation of a total of 60 observations.
(Rate of Change in Luminance)

Luminance of the display screen was measured under a condition in which the display unit 30 was controlled to display a white color (maximum brightness). To perform such measurements, an LS-100 Luminance Meter (made by Konica Minolta) was used. The measurement distance from the display screen was set at 300 mm, the measurement angle was set at 2°, and the interior illumination was set at less than or equal to 1 lx, respectively.

With the luminance of the A region being represented by La $[cd/m^2]$ and the luminance of the B region being represented by Lb [cd/m$^2$], the rate of change in luminance (units: %) was calculated as 100×(Lb−La)/La. The measurement position inside the region B was set in proximity to a boundary with the region A, taking into consideration in-plane uniformity.

[Results]

(Moiré Phenomena)

In the following Table 3, results are shown of sensory evaluations, and more specifically, of evaluation values rounded to one decimal place, in relation to Inventive Examples 1 to 6 and Comparative Examples 1 and 2.

TABLE 3

|  | Refractivity Index n1 | Relative Refractivity Index nr1 | Evaluation Value (average) |
| --- | --- | --- | --- |
| Comparative Example 1 | 1.34 | 0.81 | 3.7 |
| Inventive Example 1 | 1.42 | 0.86 | 4.0 |
| Inventive Example 2 | 1.50 | 0.91 | 4.6 |
| Inventive Example 3 | 1.60 | 0.97 | 4.6 |
| Inventive Example 4 | 1.70 | 1.03 | 4.4 |
| Inventive Example 5 | 1.78 | 1.08 | 4.6 |
| Inventive Example 6 | 1.90 | 1.15 | 4.0 |
| Comparative Example 2 | 1.98 | 1.20 | 3.6 |

Figure 18:
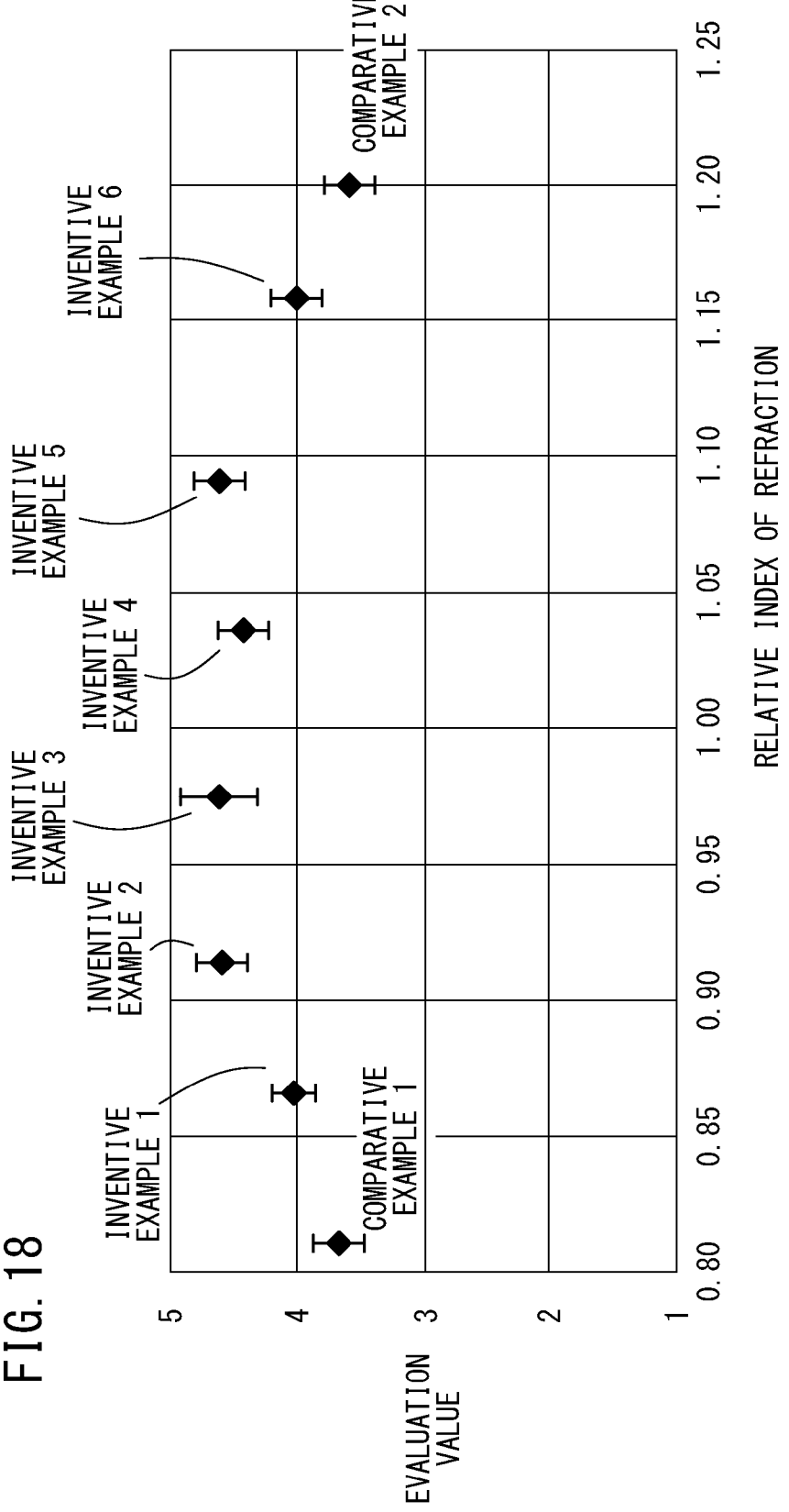
FIG. 18 is an explanatory diagram showing results of a sensory evaluation performed in relation to the present embodiment.

FIG. 18 is an explanatory diagram showing results of a sensory evaluation performed in relation to the present embodiment. Relative indices of refraction nr1 are indicated on the horizontal axis of the graph, and sensory evaluation values of moiré phenomena are indicated on the vertical axis. Average values of the sensory evaluation values are shown by plots, and ranges of variation (±2σ) thereof are shown by error bars.

As shown in FIG. 18 and in Table 3, in any of Inventive Examples 1 to 6 and Comparative Examples 1 and 2, the evaluation values exceeded 3, and a reduced effect in moiré phenomena was obtained by eliminating the air layer. Among these results, in any of Inventive Examples 1 to 6, the evaluation values exceeded 4, and compared to Comparative Examples 1 and 2, more significant effects were observed. In the case that the relative index of refraction nr1 satisfied the inequality 0.86≤nr1≤1.15, results were obtained indicating that moiré phenomena could be suppressed.

(Rate of Change in Luminance)

In the following Table 4, in any of Inventive Examples 1 to 6 and Comparative Examples 1 and 2, the rate of change in luminance was positive, and luminance of the display screen was enhanced by eliminating the air layer (air gap).

TABLE 4

|  | Rate of Change in Luminance (%) |
| --- | --- |
| Comparative Example 1 | 15.1 |
| Inventive Example 1 | 18.9 |
| Inventive Example 2 | 21.7 |
| Inventive Example 3 | 21.9 |
| Inventive Example 4 | 21.2 |
| Inventive Example 5 | 20.0 |
| Inventive Example 6 | 16.5 |
| Comparative Example 2 | 14.1 |

Among these results, in any of Inventive Examples 2 to 5, the rate of change in luminance exceeded 20%, and compared to Inventive Examples 1 and 6, the difference was of a degree that could be perceived visually. More specifically, if the relative index of refraction nr1 satisfied the inequality 0.91≤nr1≤1.08, results were obtained capable of further enhancing display brightness.

SUPPLEMENTAL EXPLANATIONS

Other than the above-described Inventive Examples, the following findings were obtained based on results of similar evaluations that were performed while changing the production conditions of the conductive laminate body 10 in various ways.

(1) The material of the transparent substrate 12 is not limited to PET, and in a range that satisfies the above-described relationship of the relative indices of refraction nr1 and nr2, the same experimental results were obtained regardless of the material. Further, if the second protective layer 26b and the first protective layer 26a are made of different materials, similar results are obtained in a range that satisfies the above-described relationship.

(2) By making any one of the relative indices of refraction nr1, nr2 greater than or equal to 0.86 and less than or equal to 1.15, an effect was obtained in which moiré phenomena was reduced. In addition, by making both of the relative indices of refraction nr1, nr2 greater than or equal to 0.86 and less than or equal to 1.15, a significantly reduced effect was obtained.

(3) By making any one of the relative indices of refraction nr1, nr2 greater than or equal to 0.91 and less than or equal to 1.08, an effect was obtained in which the amount of light irradiated externally through the display screen, i.e., the brightness of the display, was enhanced. In addition, by making both of the relative indices of refraction nr1, nr2 greater than or equal to 0.91 and less than or equal to 1.08, a significantly enhanced effect was obtained.

(4) Even if the conductive laminate body 10 is arranged in a state of having the front and back thereof inverted, the same evaluation results described above were obtained.

The present invention is not limited to the embodiments described above, but various changes and modifications may be made thereto without departing from the scope of the invention.

The invention claimed is:

1. A conductive laminate body comprising:
a substrate;
a first conductive portion made up from a plurality of thin metal wires and which is formed on one main surface of the substrate;
a first protective layer disposed on the one main surface in covering relation to the first conductive portion;
a second conductive portion made up from a plurality of thin metal wires and which is formed on another main surface of the substrate; and
a second protective layer disposed on the other main surface in covering relation to the second conductive portion,
wherein, by combining the first conductive portion and the second conductive portion, a mesh pattern is formed in which same mesh shapes are arranged regularly as viewed in plan, and
at least one of a relative index of refraction of the substrate with respect to the first protective layer and a relative index of refraction of the substrate with respect to the second protective layer is 0.86 to 1.15,
wherein a rate of change in luminance is 16.5% or more which is represented by 100×(Lb−La)/La where La denotes luminance in a region that does not form the first protective layer, and Lb denotes luminance in a region that forms the first protective layer, the luminance measured with white light irradiating the conductive laminate body.

2. The conductive laminate body according to claim 1, wherein at least one of the relative index of refraction of the substrate with respect to the first protective layer and the relative index of refraction of the substrate with respect to the second protective layer is 0.91 to 1.08.

3. The conductive laminate body according to claim 2, wherein at least one of the relative index of refraction of the substrate with respect to the first protective layer and the relative index of refraction of the substrate with respect to the second protective layer is substantially equal to 1.

4. The conductive laminate body according to claim 3, wherein at least one of the first protective layer and the second protective layer is made of a same material as the substrate.

5. The conductive laminate body according to claim 1, wherein:
the substrate is made of polyethylene terephthalate; and
at least one of the first protective layer and the second protective layer is made of any of polychlorotrifluoroethylene, polymethylmethacrylate, polystyrene, polyethylene terephthalate, polythiourethane, and high refractive index glass.

6. The conductive laminate body according to claim 1, wherein:
the first conductive portion includes at least two first conductive patterns that extend in a first direction, and are arranged in a second direction perpendicular to the first direction;
the second conductive portion includes at least two second conductive patterns that extend in the second direction, and are arranged in the first direction; and
each of the first conductive patterns and the second conductive patterns comprises a combination of at least two lattices.

7. The conductive laminate body according to claim 6, wherein:
the first conductive pattern is constituted by connecting at least two first sensing units in series in the first direction;
each of the first sensing units comprises a combination of at least two of the lattices;
the second conductive pattern is constituted by connecting at least two second sensing units in series in the second direction; and
each of the second sensing units comprises a combination of at least two of the lattices.

8. The conductive laminate body according to claim 6, wherein:
each of the lattices is diamond-shaped; and
vertex angles of each of the lattices are greater than or equal to 60° and less than 90°, or greater than 90° and less than or equal to 120°.

9. A touch panel comprising:
the conductive laminate body according to claim 1; and
a detection control unit for detecting a contact position or a proximity position from a side of a main surface of the conductive laminate body.

10. A display device comprising:
the conductive laminate body according to claim 1;
a detection control unit for detecting a contact position or a proximity position from a side of a main surface of the conductive laminate body; and
a display unit that displays an image on a display surface based on a display signal,
wherein the conductive laminate body is disposed on the display surface.

11. The conductive laminate body according to claim 1, wherein
the first conductive portion made up from a plurality of thin metal wires is disposed directly on one main surface of the substrate, and
the second conductive portion made up from a plurality of thin metal wires is disposed directly on the another main surface of the substrate.

12. The conductive laminate body according to claim 1, further comprising:
a first adhesive layer provided between the one main surface of the substrate and the first protective layer; and
a second adhesive layer provided between the another main surface of the substrate and the second protective layer.

13. A conductive laminate body comprising:
a first substrate;
a first conductive portion made up from a plurality of thin metal wires and which is formed on one main surface of the first substrate;
a first protective layer disposed on the one main surface of the first substrate in covering relation to the first conductive portion;
a second substrate;
a second conductive portion made up from a plurality of thin metal wires and which is formed on one main surface of the second substrate; and
a second protective layer disposed on the one main surface of the second substrate in covering relation to the second conductive portion,
wherein, by combining the first conductive portion and the second conductive portion, a mesh pattern is formed in which same mesh shapes are arranged regularly as viewed in plan, and
at least one of a relative index of refraction of the first substrate with respect to the first protective layer and a relative index of refraction of the second substrate with respect to the second protective layer is 0.86 to 1.15,
wherein a rate of change in luminance is 16.5% or more which is represented by 100×(Lb−La)/La where La denotes luminance in a region that does not form the first protective layer, and Lb denotes luminance in a region that forms the first protective layer, the luminance measured with white light irradiating the conductive laminate body.

14. The conductive laminate body according to claim 13, wherein at least one of the relative index of refraction of the first substrate with respect to the first protective layer and the relative index of refraction of the second substrate with respect to the second protective layer is 0.91 to 1.08.

15. The conductive laminate body according to claim 14, wherein at least one of the relative index of refraction of the first substrate with respect to the first protective layer and the relative index of refraction of the second substrate with respect to the second protective layer is substantially equal to 1.

16. The conductive laminate body according to claim 15, wherein the first protective layer is made of a same material as the first substrate, and/or the second protective layer is made of a same material as the second substrate.

17. The conductive laminate body according to claim 13, wherein:
the first substrate is made of polyethylene terephthalate, and the first protective layer is made of any of polychlorotrifluoroethylene, polymethylmethacrylate, polystyrene, polyethylene terephthalate, polythiourethane, and high refractive index glass; and/or the second substrate is made of polyethylene terephthalate, and the second protective layer is made of any of polychlorotrifluoroethylene, polymethylmethacrylate, polystyrene, polyethylene terephthalate, polythiourethane, and high refractive index glass.

18. The conductive laminate body according to claim 13, wherein:
   the first conductive portion includes at least two first conductive patterns that extend in a first direction, and are arranged in a second direction perpendicular to the first direction;
   the second conductive portion includes at least two second conductive patterns that extend in the second direction, and are arranged in the first direction; and
   each of the first conductive patterns and the second conductive patterns comprises a combination of at least two lattices.

19. The conductive laminate body according to claim 18, wherein:
   the first conductive pattern is constituted by connecting at least two first sensing units in series in the first direction;
   each of the first sensing units comprises a combination of at least two of the lattices;
   the second conductive pattern is constituted by connecting at least two second sensing units in series in the second direction; and
   each of the second sensing units comprises a combination of at least two of the lattices.

20. The conductive laminate body according to claim 18, wherein:
   each of the lattices is diamond-shaped; and
   vertex angles of each of the lattices are greater than or equal to 60° and less than 90° or greater than 90° and less than or equal to 120°.

21. A touch panel comprising:
   the conductive laminate body according to claim 13; and
   a detection control unit for detecting a contact position or a proximity position from a side of a main surface of the conductive laminate body.

22. A display device comprising:
   the conductive laminate body according to claim 13;
   a detection control unit for detecting a contact position or a proximity position from a side of a main surface of the conductive laminate body; and
   a display unit that displays an image on a display surface based on a display signal,
   wherein the conductive laminate body is disposed on the display surface.

23. The conductive laminate body according to claim 13, wherein
   the first conductive portion made up from a plurality of thin metal wires is disposed directly on the one main surface of the first substrate, and
   the second conductive portion made up from a plurality of thin metal wires is disposed directly on the one main surface of the second substrate.

24. The conductive laminate body according to claim 13, further comprising:
   a first adhesive layer provided between the one main surface of the first substrate and the first protective layer; and
   a second adhesive layer provided between the one main surface of the second substrate and the second protective layer.

* * * * *